(12) United States Patent
Lee et al.

(10) Patent No.: US 9,311,981 B2
(45) Date of Patent: Apr. 12, 2016

(54) SEMICONDUCTOR MEMORY DEVICE HAVING VARIABLE RESISTANCE MEMORY AND OPERATING METHOD

(71) Applicants: Wonseok Lee, Suwon-Si (KR);
Seonghyun Jeon, Seoul (KR);
Youngkug Moon, Suwon-Si (KR); Dong Hwi Kim, Yongin-Si (KR)

(72) Inventors: Wonseok Lee, Suwon-Si (KR);
Seonghyun Jeon, Seoul (KR);
Youngkug Moon, Suwon-Si (KR); Dong Hwi Kim, Yongin-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 294 days.

(21) Appl. No.: 13/954,161

(22) Filed: Jul. 30, 2013

(65) Prior Publication Data
US 2014/0043892 A1 Feb. 13, 2014

(30) Foreign Application Priority Data
Aug. 10, 2012 (KR) .................. 10-2012-0087836

(51) Int. Cl.
*G11C 11/16* (2006.01)

(52) U.S. Cl.
CPC ............ *G11C 11/1675* (2013.01); *G11C 11/16* (2013.01)

(58) Field of Classification Search
USPC ......................................... 365/158, 171, 148
See application file for complete search history.

(56) References Cited

U.S. PATENT DOCUMENTS

| | | | |
|---|---|---|---|
| 6,577,527 B2 | 6/2003 | Freitag et al. | |
| 6,747,301 B1 * | 6/2004 | Hiner et al. | 257/295 |
| 6,999,339 B2 | 2/2006 | Tuttle et al. | |
| 7,355,882 B2 | 4/2008 | Boeve | |
| 7,474,547 B2 | 1/2009 | Lenssen | |
| 2004/0130936 A1 * | 7/2004 | Nguyen et al. | 365/158 |
| 2006/0262585 A1 | 11/2006 | Lenssen | |
| 2007/0070686 A1 * | 3/2007 | Boeve | 365/158 |
| 2007/0081381 A1 | 4/2007 | Lenssen | |
| 2007/0153572 A1 | 7/2007 | Boeve | |
| 2008/0080232 A1 * | 4/2008 | Sturm et al. | 365/158 |

FOREIGN PATENT DOCUMENTS

| | | |
|---|---|---|
| KR | 10-2005-0048660 A | 5/2005 |
| KR | 10-0564866 B1 | 3/2006 |
| KR | 10-2006-0106841 A | 10/2006 |
| KR | 10-2006-0125695 A | 12/2006 |
| KR | 10-2010-0054357 A | 5/2010 |

* cited by examiner

*Primary Examiner* — Amir Zarabian
*Assistant Examiner* — Minh Dinh
(74) *Attorney, Agent, or Firm* — Volentine & Whitt, PLLC

(57) ABSTRACT

A semiconductor memory device includes a memory cell array of nonvolatile memory cells having a variable resistance element, and a conductor line array capable of generating a compensation magnetic field for the nonvolatile memory cells. A current driver selectively supplies current to conductive lines, a magnetic field sensor senses an applied external magnetic field and generates external magnetic field information, and a controller controls generation of the compensation magnetic field in response to the external magnetic field information.

16 Claims, 18 Drawing Sheets

Fig. 1
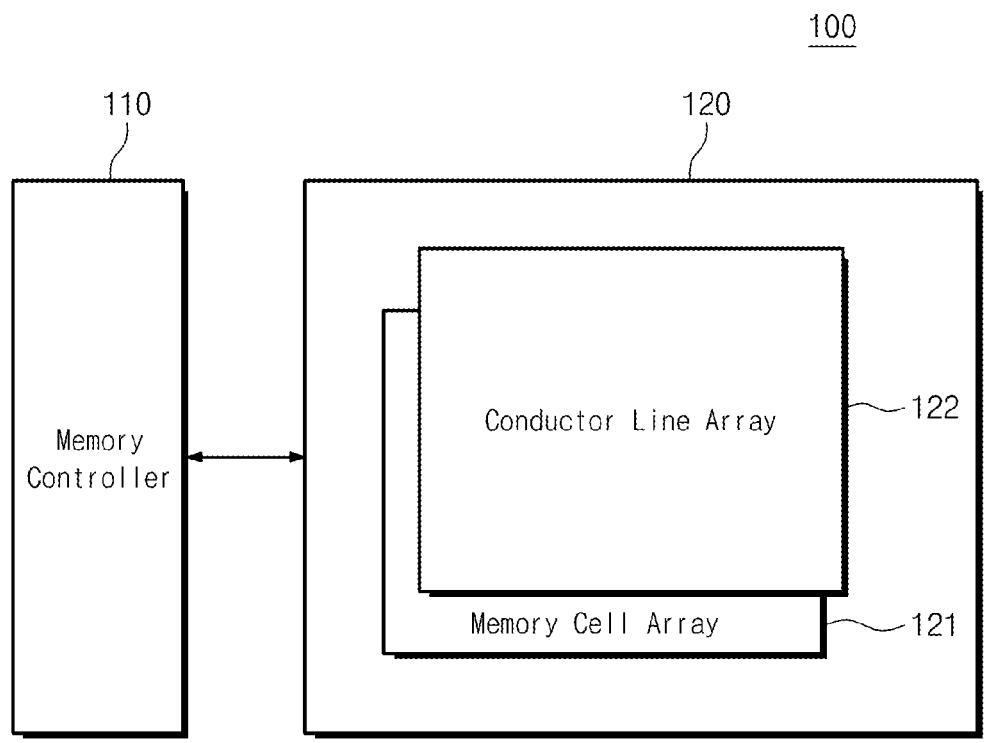
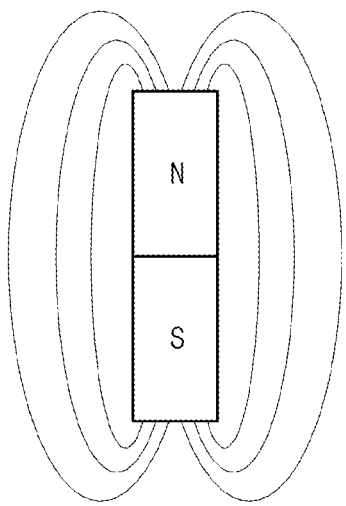

Fig. 11
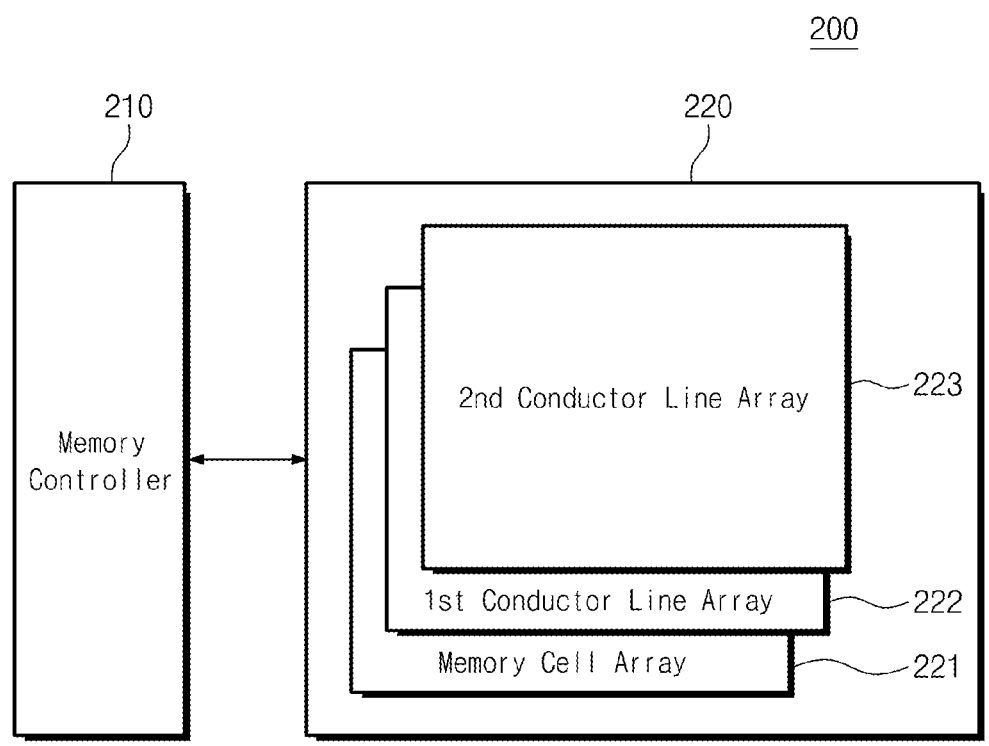
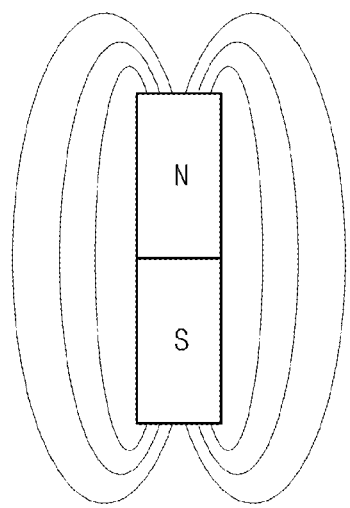

SEMICONDUCTOR MEMORY DEVICE HAVING VARIABLE RESISTANCE MEMORY AND OPERATING METHOD

CROSS-REFERENCE TO RELATED APPLICATIONS

A claim of priority under 35 U.S.C. §119 is made to Korean Patent Application No. 10-2012-087836 filed Aug. 10, 2012, the subject matter of which is hereby incorporated by reference.

BACKGROUND

The inventive concept relates generally to semiconductor memory devices including a variable resistance memory and operating methods for same.

Semiconductor memory devices may be classified as volatile or nonvolatile according to their operative nature. Volatile memory devices—including static RAM (SRAM), dynamic RAM (DRAM), synchronous DRAM (SDRAM), and the like—lose stored data in the absence of applied power. In contrast, nonvolatile memory devices are able to retain stored data in the absence of applied power. Nonvolatile memory devices include certain read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), and the like.

Emerging (or so-called "next generation") nonvolatile memory technologies offer many design and performance advantages. One example of next generation nonvolatile memory devices is the Spin Transfer Resistive Random Access Memory or STT-MRAM. The STT-MRAM uses a variable memory cell resistance to indicate a stored data value. The variable resistance of MRAM memory cells may be "written" by the application of a defined set of magnetic or electric conditions to the memory cell. For example, an STT-MRAM memory cell includes a magnetic tunnel junction (MTJ) that in certain embodiments includes a magnetically "pinned" material layer and a magnetically "free" material layer. The resistance value exhibited by the STT-MRAM memory cell is a function of the magnetization direction(s) of these two material layers.

That is, the magnetization direction of the free layer may be changed by electrical and/or magnetic factors, conditions and/or influences internal to the MRAM memory cell and/or externally applied to the MRAM memory cell. As a result, certain external magnetic fields, perhaps unintentionally applied to a MRAM memory cell, may cause a undesired change in the resistance of the MRAM memory cell. Such inadvertent changes in one or more MRAM memory cell resistances may subsequently result in stored data errors.

SUMMARY

One embodiment of the inventive concept is directed to a semiconductor memory device comprising; a memory cell array including nonvolatile memory cells respectively arranged at intersection between word lines and bit lines, each nonvolatile memory cell having a variable resistance element, a conductor line array including conductive lines establishing current paths and configured to generate a compensation magnetic field with to the nonvolatile memory cells of the memory cell array, a current driver configured to supply current to the conductive lines, a magnetic field sensor configured to sense an applied external magnetic field and in response generate external magnetic field information, and a compensation magnetic field controller configured to generate compensation magnetic field information in response to the external magnetic field information, and to control the current driver in accordance with the compensation magnetic field information.

Another embodiment of the inventive concept is directed to a semiconductor memory device comprising; a memory cell array including nonvolatile memory cells respectively arranged at intersection between word lines and bit lines, each nonvolatile memory cell having a variable resistance element, a first conductor line array including first conductive lines arranged in a first direction, and a second conductor line array including second conductive lines arranged in a second direction different from the first direction, a first current driver configured to supply a first current to the first conductive lines in response to compensation magnetic field information, and a second current driver configured to supply a second current to the second conductive lines in response to the compensation magnetic field information, a magnetic field sensor configured to sense an applied external magnetic field and in response to generate external magnetic field information, and a compensation magnetic field controller configured to generate the compensation magnetic field information in response to the external magnetic field information, and to control the first and second current driver in accordance with the compensation magnetic field information.

Another embodiment of the inventive concept is directed to a method of operating a semiconductor memory device including a memory cell array of nonvolatile memory cells, each nonvolatile memory cell having a variable resistance element, the method comprising; sensing an external magnetic field applied to the memory cell array, and in response, generating external magnetic field information, generating compensation magnetic field information based on the external magnetic field information, and generating a compensation magnetic field applied to the memory cell array in accordance with the compensation magnetic field information.

BRIEF DESCRIPTION OF THE DRAWINGS

Certain embodiments of the inventive concept are illustrated in the accompanying drawings.

FIG. 1 is a general block diagram illustrating a memory system according to an embodiment of the inventive concept.

FIG. 11 is a block diagram illustrating a memory system according to another embodiment of the inventive concept.

DETAILED DESCRIPTION

Figure 2:
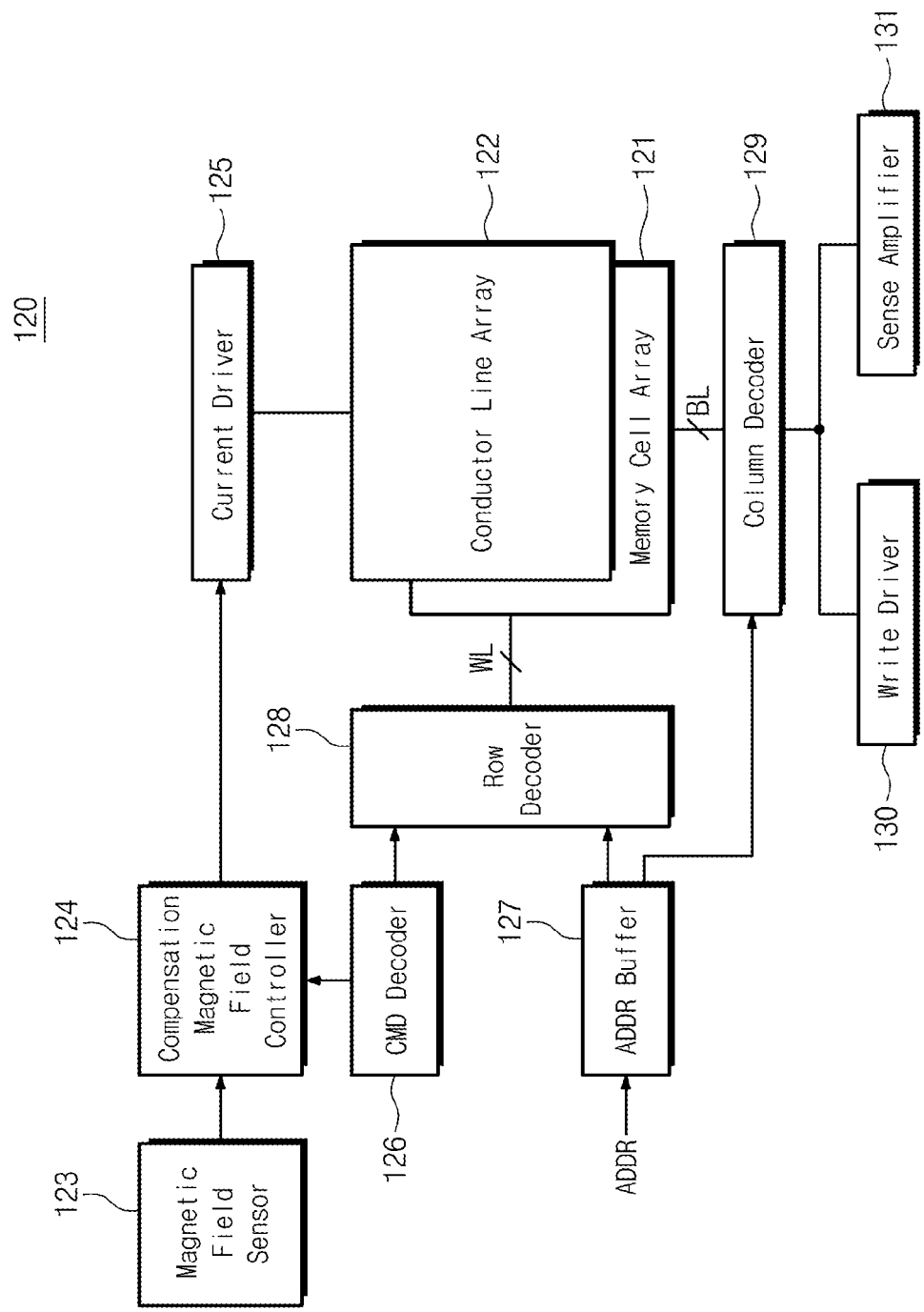
FIG. 2 is a block diagram further illustrating the nonvolatile semiconductor memory device of FIG. 1.

Embodiments of the inventive concept will now be described in some additional detail with reference to the accompanying drawings. The inventive concept, however, may be embodied in various different forms, and should not be construed as being limited to only the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numbers and labels denote like or similar elements throughout the attached drawings and written description. In the drawings, the size(s) and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram illustrating a memory system according to an embodiment of the inventive concept. Referring to FIG. 1, a memory system 100 generally comprises a memory controller 110 and a semiconductor memory device 120. The semiconductor memory device 120 is assumed to be a variable resistance memory and in certain embodiments is further assumed to be a magneto-resistive random access memory (MRAM). However, the scope of the inventive concept is not limited to only embodiments including such memory devices.

FIG. 1 illustrates an example in which the memory system 100 is placed proximate to (or within the area of) an external magnetic field. Herein, the magnetic field area may be understood as a physical space affected (or electro-magnetically influenced) by the external magnetic field. For example, a memory cell array 121 of the semiconductor memory device 120 may fall within the magnetic field area of the external magnetic field, and may thus become influenced by the external magnetic field. The memory controller 110 may be electrically connected to a host (now shown) as well as to the semiconductor memory device 120. Thus, the memory controller 110 may be configured to access (e.g., read, erase and/or write) data stored in the semiconductor memory device 120 in response to a request of the host.

In the illustrated example of FIG. 1, the semiconductor memory device 120 comprises a memory cell array 121 and a corresponding conductor line array 122.

The memory cell array 121 includes a plurality of word lines, a plurality of bit lines, and a plurality of memory cells respectively arranged at intersections between the word lines and the bit lines. The memory cells may be formed of the same elements or different types of elements. Each memory cell may be implemented using a variable resistance element.

Alternatively, some part of each memory cell may be implemented using a variable resistance element, while the remaining part of the memory cell is implemented similar to a flash memory cell. In any embodiment wherein a memory cell is implemented using a variable resistance element, the resistance value exhibited by the variable resistance element may be varied by application of (e.g., coming into close proximity with) an external magnetic field. This possibility of inadvertently changed data must be addressed in the design and operation of a memory system incorporating such memory cells.

The conductor line array 122 may be used in certain embodiments to generate a "compensation magnetic field" with respect to one or more memory cells arranged in the memory cell array 121. That is, the conductor line array 122 may be used to generate one or more compensation magnetic field(s) to control for (or compensate) the influence of the applied external magnetic field upon memory cells in the memory cell array 121. Hence, the conductor line array 122 may include conductive lines that form a plurality of current paths. For example, a compensation magnetic field may be generated with a same magnitude and opposite magnetization direction (or polarity) as the applied external magnetic field. Any reasonable combination of magnitude and direction may be used to define a compensation magnetic field capable of controlling the influence of an applied external magnetic field upon the memory cell array 121.

In certain embodiments, the conductor line array 122 may be placed on the memory cell array 121, or directly on the memory cell array 121. In certain embodiments, the conductor line array 121 may be spaced apart from the memory cell array 121 in a direction perpendicular to a substrate upon which the memory cell array 121 has been fabricated. In other embodiments, the conductor line array 122 may be disposed lateral to (or alongside of) the memory cell array 121.

Selected application of well-defined compensation magnetic field(s) by embodiments of the inventive concept allows for the mitigation of any deleterious effects caused by an applied external magnetic field. This improves the overall reliability of data stored in the semiconductor memory device 120.

FIG. 2 is a block diagram further illustrating the semiconductor memory device of FIG. 1.

Referring to FIG. 2, the semiconductor memory device 120 comprises a memory cell array 121, a conductor line array 122, a magnetic field sensor 123, a compensation magnetic field controller 124, a current driver 125, a command decoder 126, an address buffer 127, a row decoder 128, a column decoder 129, a write driver 130, and a sense amplifier 131.

The memory cell array 121 may include a plurality of memory cells which are implemented by variable resistance elements. For example, the memory cells of the memory cell array 121 may be implemented by STT-MRAM (Spin Transfer Resistive Random Access Memory) cells. In this case, each memory cell may include a magnetic tunnel junction (MJT) element having a magnetic material. Various embodiments of the memory cell array 121 and related memory cells will be set forth in FIGS. 4, 5, 6 and 7 that follow.

The conductor line array 122 may be used to generate a compensation magnetic field capable of controlling the influences of an applied external magnetic field upon the memory cell array 121. The conductor line array 122 may include conductive lines that form a plurality of current paths that may be used to generate the compensation magnetic field.

The magnetic field sensor 123 may be used to sense an applied external magnetic field (i.e., an external magnetic field sufficiently proximate and/or strong enough) to possible influence the memory cells of the memory cell array 121. That is, the magnetic field sensor 123 senses an applied external magnetic field and in response generates external magnetic field information characterizing (e.g., by magnitude and/or direction) the external magnetic field.

The compensation magnetic field controller 124 receives the external magnetic field information from the magnetic field sensor 123, and in response generates an appropriate compensation magnetic field. For example, the compensation magnetic field controller 124 may be used to control the current driver 125 based on the compensation magnetic field information. In one embodiment, the compensation magnetic field information may include magnitude information characterizing the sensed magnitude of the external magnetic field, and direction information characterizing the sensed direction of the external magnetic field.

In certain embodiments, the current driver 125 may be used to supply a current to the conductor line array 122 under the control of the compensation magnetic field controller 124. The current driver 125 may provide a current to one, some or all of conductive lines (hereafter, denoted as "conductive line(s)") in the conductor line array 122. For example, the current driver 125 may provide the conductor line array 122 with a current sufficient to generate a desired compensation magnetic field based on corresponding magnitude information. Similarly, the current driver 125 may provide a conductive line(s) of the conductor line array 122 with a current sufficient to generate a desired compensation magnetic field based on corresponding direction information.

The command decoder 126 may be used to decode signals from a memory controller 110 such as a chip select signal /CS, a row address strobe signal /RAS, a column address strobe signal /CAS, a write enable signal /WE, a clock enable signal CKE, etc. If decoding is completed, the command decoder 126 may control the semiconductor memory device 120 to perform a command from the memory controller 110.

The command decoder 126 may decode a block erase signal, a chip erase signal, and a random erase signal from the memory controller 110, and may be used control the compensation magnetic field controller 124. This will be described in some additional detail with reference to FIGS. 8, 9 and 10.

The address buffer 127 may store an address signal ADDR input from the memory controller 110. The address buffer 127 may provide a row address to the row decoder 128 and a column address to the column decoder 129.

Each of the row and column decoders 128 and 129 may include a plurality of MOS transistor-based switches. The row decoder 128 may select a word line in response to the row address, and the column decoder 129 may select a bit line in response to the column address.

The write driver 130 may provide the memory cell array 121 through a bit line with a write current corresponding to write-requested data at a write operation. The write driver 130 may provide a read current to the memory cell array 121 through a bit line at a read operation.

The sense amplifier 131 may receive and amplify a data voltage via a bit line at a read operation. The sense amplifier 131 may include a plurality of sense amplifier circuits to sense and amplify data voltages. For example, each sense amplifier may compare a data voltage with a reference voltage to output a comparison result as a digital data signal.

Figure 3:
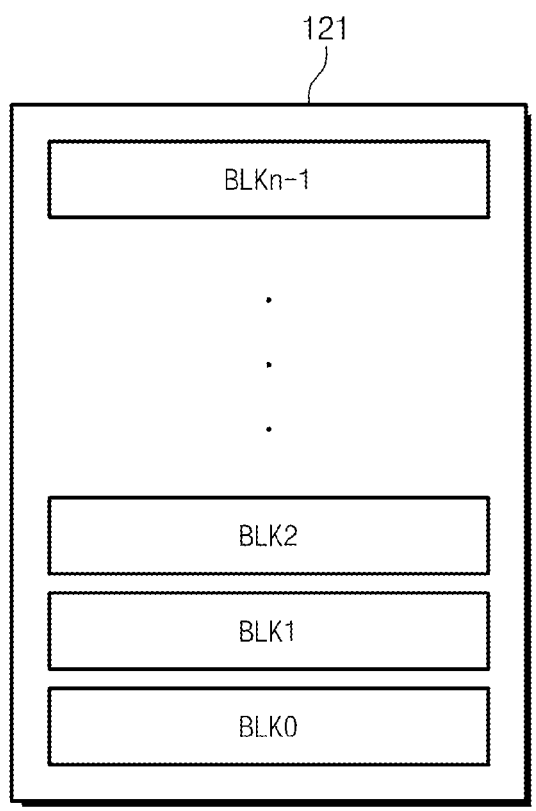
FIG. 3 is a block diagram further illustrating the memory cell array of FIG. 2.

FIG. 3 is a block diagram further illustrating the memory cell array 121 of FIG. 2.

Referring to FIG. 3, the memory cell array 121 may include a plurality of memory blocks BLK0 to BLKn−1, where "n" is a natural number greater than 1. Each of the memory blocks BLK0 to BLKn−1 may include a plurality of memory cells. The semiconductor memory device 120 may perform independent write operation(s) with respect to the memory blocks BLK0 to BLKn−1. This operating approach will be described in some additional detail with reference to FIGS. 8, 9 and 10.

Figure 4:
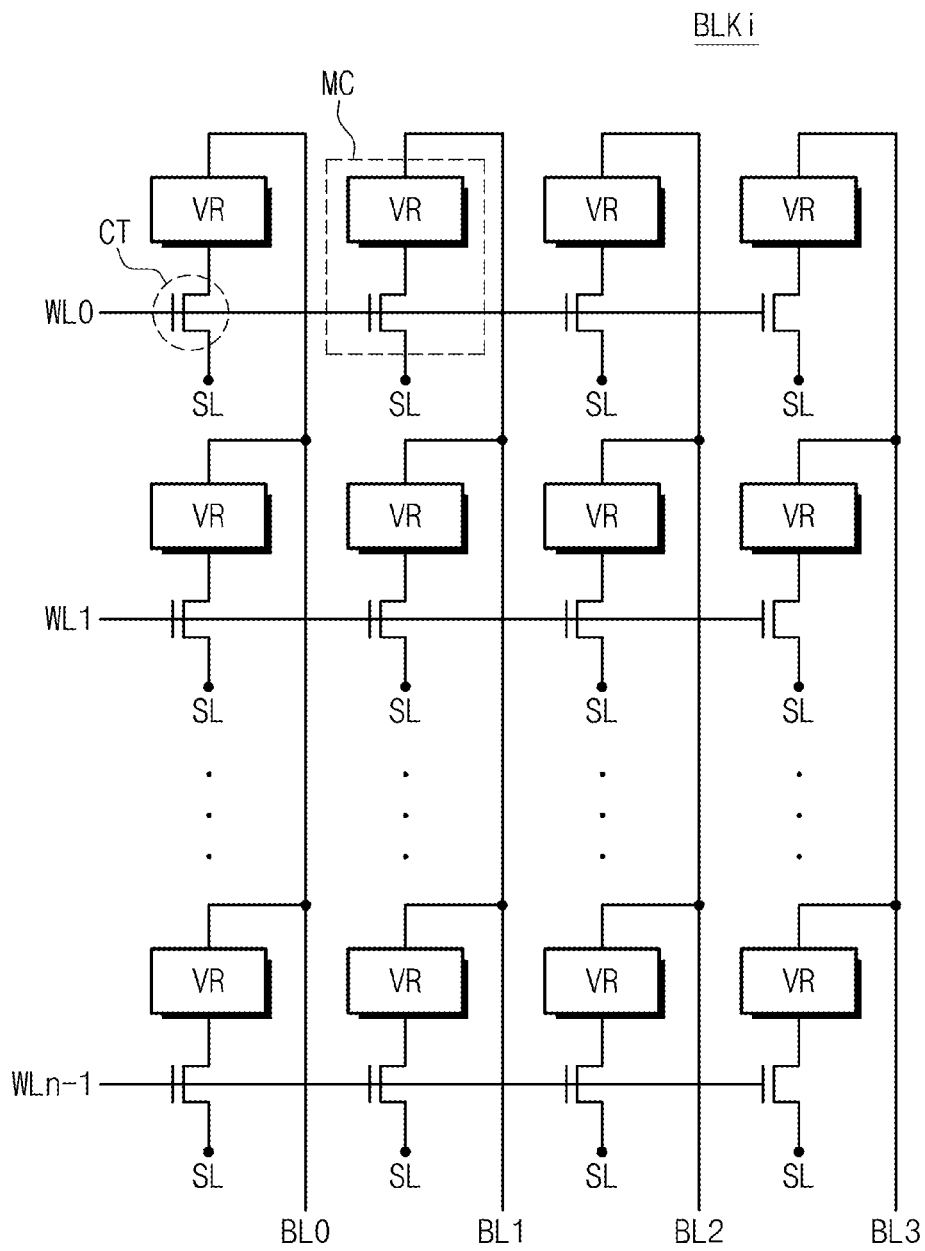
FIG. 4 is a partial circuit diagram further illustrating one memory block of the memory cell array of FIG. 3.

FIG. 4 is a partial circuit diagram further illustrating one of the memory blocks shown in FIG. 3. It is assumed that a memory block BLKi is connected to only four (4) bit lines BL1 to BL4 in the illustrated embodiment but this is merely an example and those skilled in the art will understand that many bit lines may be connected in practical embodiments of the inventive concept.

Referring to FIG. 4, the memory block BLKi includes a plurality of memory cells (MC), each of which includes a variable resistance element (VR) and a cell transistor (CT). The variable resistance element may have a resistance value that varies according to a magnitude and a direction of an applied current or voltage. Provided another current or voltage is not applied to the variable resistance element its current resistance value should remain. In other words, the variable resistance element exhibits a nonvolatile resistance characteristic.

As described with reference to FIG. 2, each memory cell may be formed of an STT-MRAM element in certain embodiments of the inventive concept. In such embodiments, a magnetic tunnel junction (MTJ) element may be used as a variable resistance element. In other embodiments, the variable resistance element may be implemented using a PRAM (Phase Change Random Access Memory), a RRAM (Resistive Random Access Memory) using a variable resistance material such as complex metal oxide, or a RRAM (Resistive Random Access Memory) using a ferromagnetic material. Hereafter, it is assumed that the MTJ used is a variable resistance element.

In each memory cell of FIG. 4, the gate of a cell transistor (CT) is connected to a word line (e.g., WL0) so that the cell transistor may be switched by an applied word line signal. The drain of the cell transistor is connected to a magnetic tunnel junction (MTJ) element, and the source of the cell transistor is connected to a source line (SL). In certain embodiments, the sources of the cell transistors will be commonly connected to a source line. In other embodiments, the sources of the cell transistors will be connected to different respective source lines.

Figure 5:
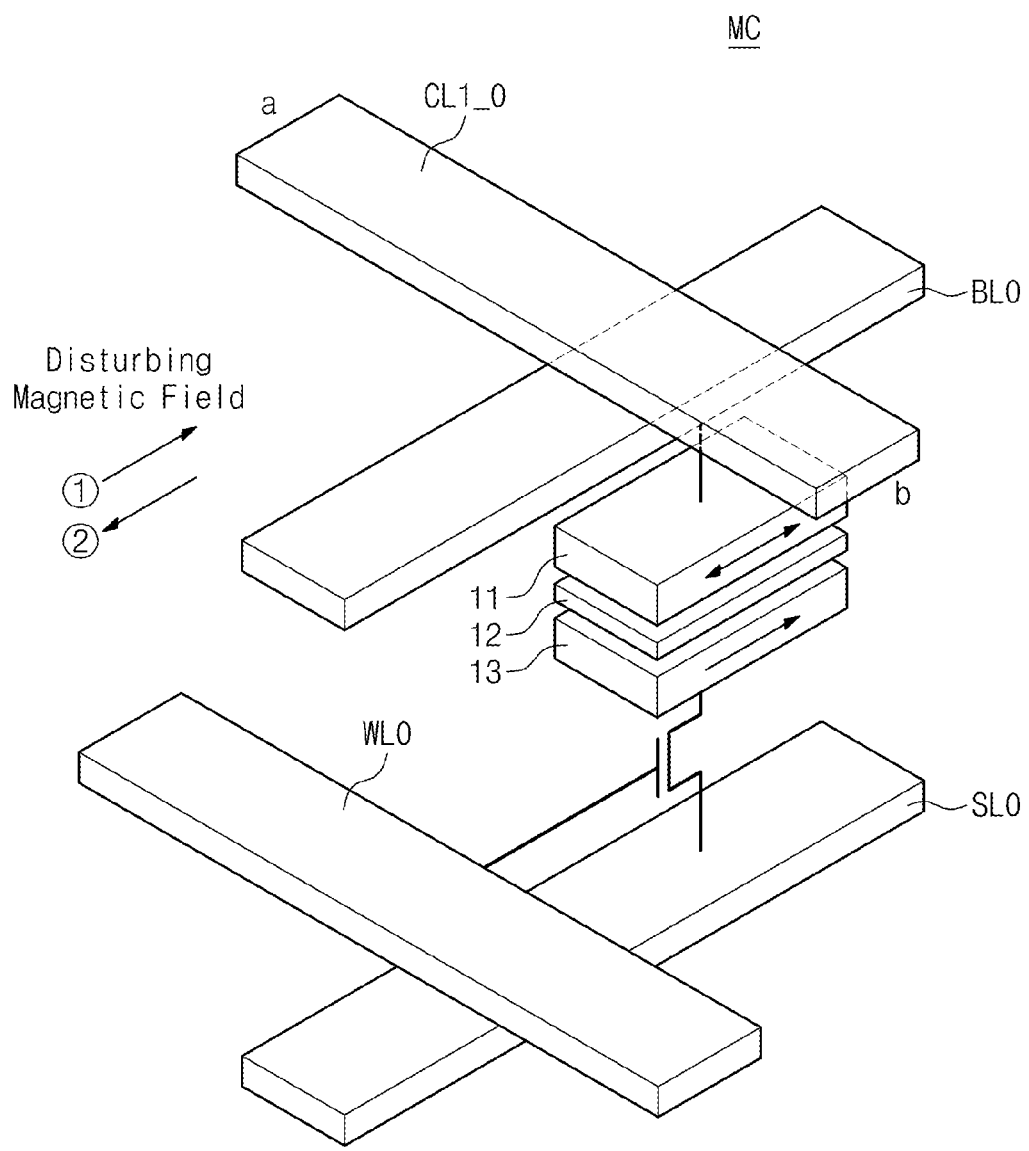
FIG. 5 is a perspective diagram illustrating one possible arrangement of elements forming a variable-resistance magnetic memory cell that may be used in the circuit of FIG. 4.

FIG. 5 is a perspective view illustrating one possible arrangement of memory cell elements for the memory cell (MC) of FIG. 4.

In FIG. 5, it is assumed that conductive lines of the conductor line array 122 are disposed lateral to word lines of the memory cell array 121. However, the scope of the inventive concept is not limited to only this architecture. In other embodiments, the conductive lines of the conductor line array 122 might be disposed lateral to bit lines of the memory cell array 121.

Referring to FIG. 5, a memory cell MC comprises an MTJ element 11 to 13 and a cell transistor CT. A gate of the cell transistor CT may be connected to a word line (e.g., WL0), and one end of the cell transistor CT may be connected to a bit line (e.g., BL0) via the MTJ element. The other end of the cell transistor CT may be connected to a source line (e.g., SL0).

The MTJ element may include a pinned layer 13, a free layer 11, and a tunnel layer 12. The tunnel layer 12 may be interposed between the pinned layer 13 and the free layer 11. A magnetization direction of the pinned layer 13 may be pinned. A magnetization direction of the free layer 11 may have the same direction as the pinned layer 13 or a magnetization direction opposite to the pinned layer 13. An anti-ferromagnetic layer (not shown) may be further provided to pin a magnetization direction of the pinned layer 13.

The free layer 11 may include a material having a variable magnetization direction. A magnetization direction of the free layer 11 may be changed by an electric/magnetic factor provided from the outside or inside of the memory cell. The free layer 11 may include a ferromagnetic material including at least one of Co, Fe, or Ni. For example, the free layer 11 may include at least one selected from a group of FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The tunnel layer 12 may have a thickness thinner than a spin diffusion distance. The tunnel layer 12 may include a nonmagnetic material. For example, the tunnel layer 12 may include at least one selected from a group of oxides of Mg, Ti, Al, MgZn, and MgB and nitrides of Ti and V.

The pinned layer 13 may have a magnetization direction pinned by an anti-ferromagnetic layer. Also, the pinned layer 13 may include a ferromagnetic material. For example, the pinned layer 13 may include at least one selected from a group of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The anti-ferromagnetic layer may include an anti-ferromagnetic material. For example, the anti-ferromagnetic layer may include at least one selected from a group of PtMn, IrMn, MnO, MnS, MnTe, $MnF_2$, $FeCl_2$, FeO, $CoCl_2$, CoO, $NiCl_2$, NiO, and Cr.

During a read operation directed to STT-MRAM memory cell, a high-level voltage is applied to the word line WL0 to turn "ON" the cell transistor CT, and a read current is provided in a direction from the bit line BL0 to the source line SL0. Data stored at the MTJ element may be read according to a resistance value detected under the above bias conditions.

During a write operation of STT-MRAM memory cell, a high-level voltage is applied to the word line WL0 to turn ON the cell transistor CT, and a write current may be provided between the bit line BL0 and the source line SL0. A conductive line CL1_0 of a conductor line array 122 (refer to FIG. 4) may be disposed on the bit line BL0. The conductive line CL1_0 may be disposed in a spaced apart manner from the bit line BL0. The conductive line CL1_0 may be disposed to be perpendicular to a magnetization direction of the free layer 11 of the MTJ element at one side. Thus, a compensation magnetic field generated when a current flows via the conductive line CL1_0 may control influence of an external magnetic field to a magnetization direction of the free layer 11.

For example in one illustrated case, the external magnetic field is generated in a direction indicated in FIG. 5 by the symbol ①, a compensation magnetic field is generated by making a current flow from point "b" to point "a" via the conductive line CL1_0. In another illustrated case, the external magnetic field is generated in a direction indicated by the symbol ②, a compensation magnetic field may be generated by making a current flow from point "a" to point "b" via the conductive line CL1_0. That is, the compensation magnetic field may be generated such that its direction is opposite to a direction of the external magnetic field influencing a magnetization direction of the free layer 11.

Figure 6A:
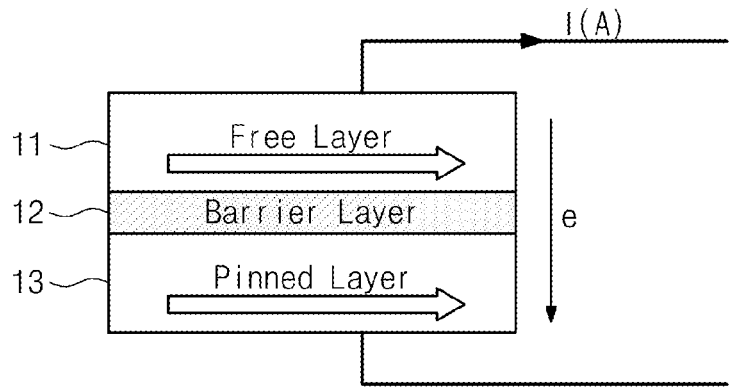
FIGS. 6A and 6B are diagrams respectively illustrating magnetization directions for an MTJ element of a STT-MRAM memory cell.
Figure 6B:
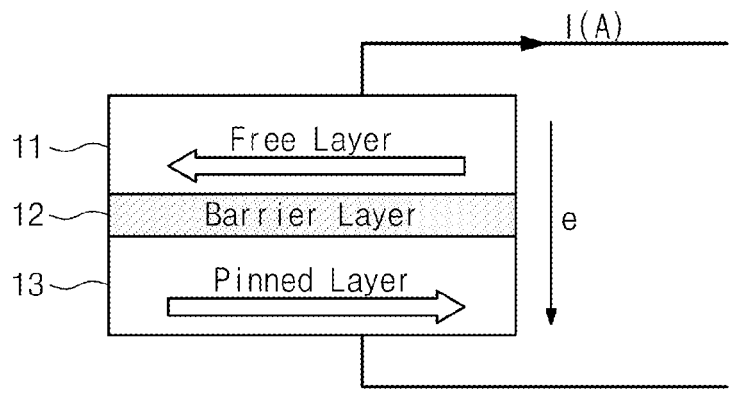

FIGS. 6A and 6B are diagrams respectively illustrating a magnetization direction for an MTJ element according to different states of binary write data ("1" or "0").

The resistance value of an MTJ element will vary according to a magnetization direction of a free layer 11. If a read current I is applied to the MTJ element, there may be output a data voltage according to a resistance value of the MTJ element. Since intensity of the read current I is less than intensity of a write current, in general, a magnetization direction of the free layer 11 may not be changed by the read current I.

Referring to FIG. 6A, magnetization directions of free and pinned layers 11 and 13 are parallel. Thus, the MTJ element will exhibit a relatively small resistance value. In such a case, a data value of '0' is read.

Referring to FIG. 6B, magnetization directions of free and pinned layers 11 and 13 are opposite of "anti-parallel". Thus, the MTJ element will exhibit a relatively large resistance value. In such a case, a data value of '1' is read.

In FIGS. 6A and 6B, the free and pinned layers 11 and 13 of the MTJ element may be illustrated as horizontal magnetic elements. However, the scope of the inventive concept is not limited thereto. For example, the free and pinned layers 11 and 13 of the MTJ element can be implemented as vertical magnetic elements.

Figure 7:
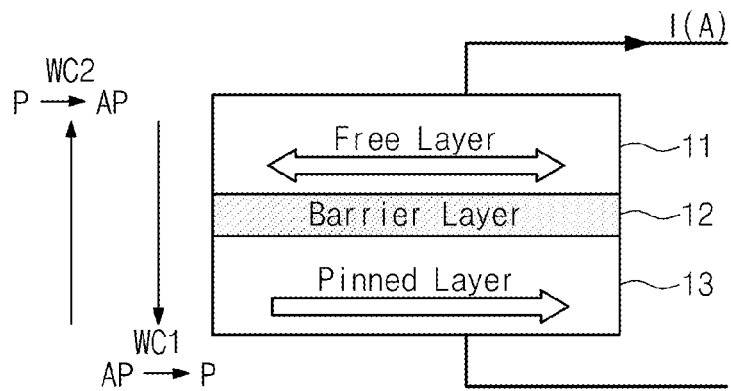
FIG. 7 is a diagram conceptually illustrating a write operation applied to a STT-MRAM memory cell.

FIG. 7 is a diagram illustrating a write operation for the STT-MRAM memory cell of FIGS. 6A and 6B.

Referring to FIG. 7, a magnetization direction of a free layer 11 may be determined according to a direction of a write current WC1/WC2 flowing via an MTJ element. For example, if a first write current WC1 is applied, free electrons having the same spin direction as a pinned layer 13 may force a torque to the free layer 11. At this time, the free layer 11 and the pinned layer 13 may be magnetized in parallel. That is, the case that the free layer 11 and the pinned layer 13 are magnetized in parallel may be understood to be the case that data '0' is written at a memory cell.

If a second write current WC2 is applied, electrons having spins opposite to the pinned layer 13 may force a torque to the free layer 11. At this time, the free layer 11 and the pinned layer 13 may be magnetized to be anti-parallel. That is, a magnetization direction of the free layer 11 may be changed by a spin transfer torque (STT). That is, the case that the free layer 11 and the pinned layer 13 are magnetized to be anti-parallel may be understood to be the case that data '1' is written at a memory cell. To write data '1' at a memory cell may be understood to the data erase concept in terms of a nonvolatile memory.

The magnetization direction of the free layer 11 may be changed by an external magnetic field. This may cause write/read errors. However, a semiconductor memory device 120 may prevent a magnetization direction of the free layer 11 from being changed by generating a compensation magnetic field capable of controlling influence of an external magnetic field.

Figure 8:
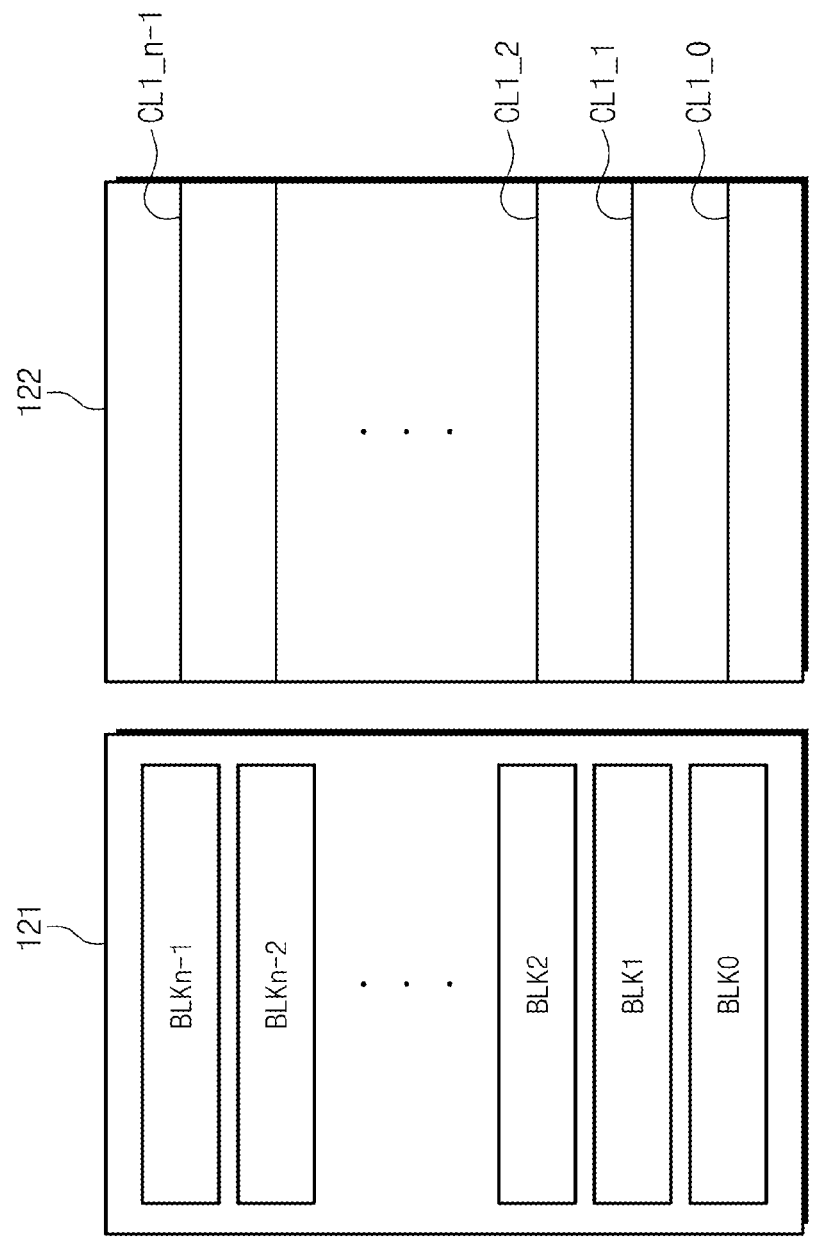
FIGS. 8, 9 and 10 are respective diagrams illustrating possible embodiments of the memory cell array and related conductor line array of FIG. 2.
Figure 9:
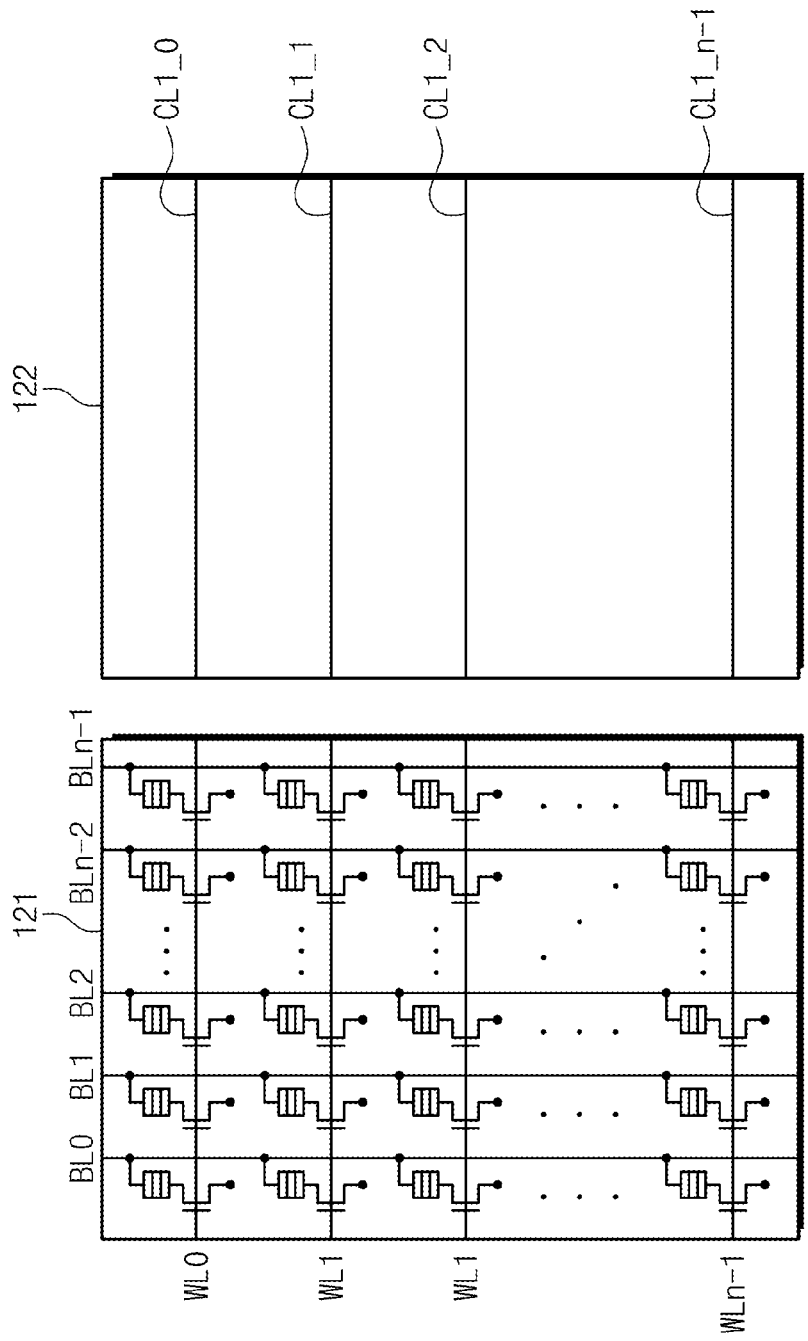
Figure 10:
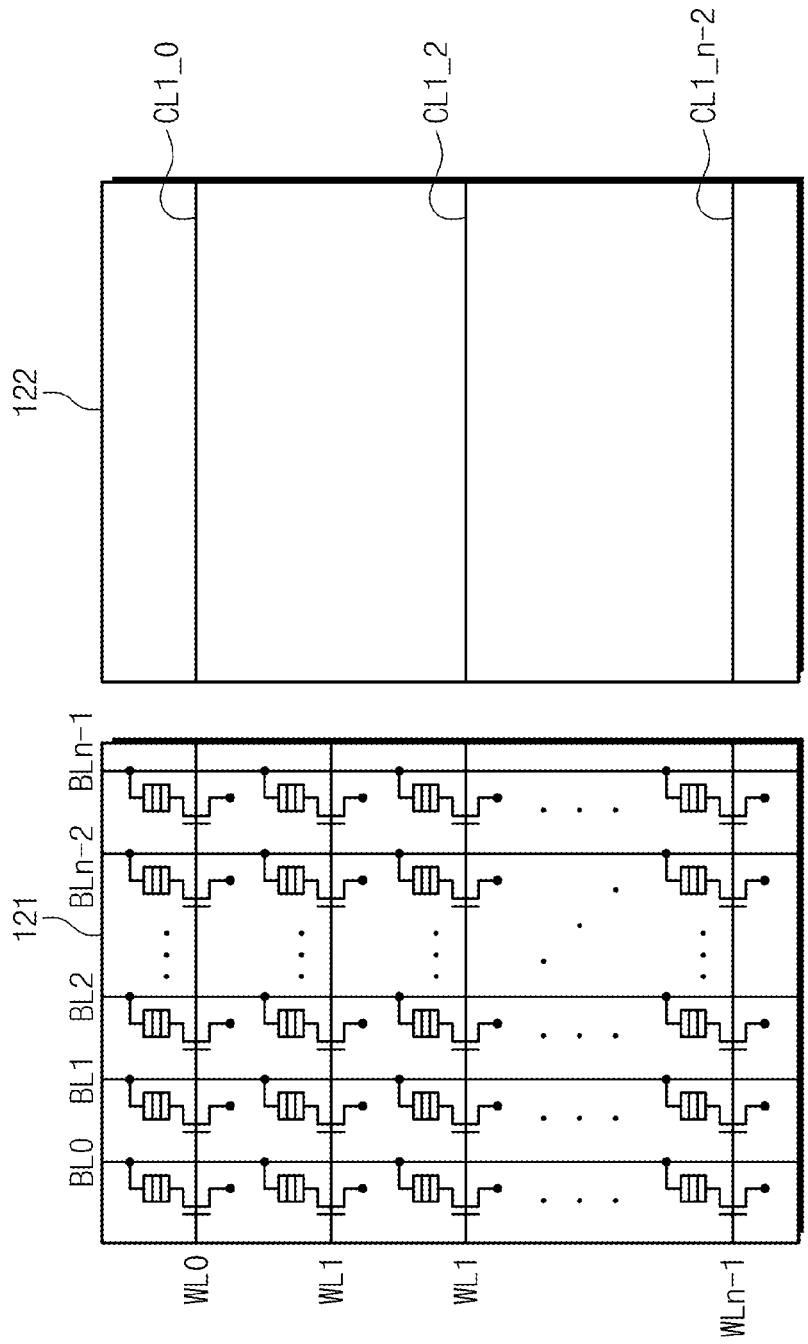

FIGS. 8, 9 and 10 are diagrams respectively illustrating different possible embodiments for the memory cell array 121 and corresponding conductor line array 122 of FIG. 2. In FIGS. 8, 9 and 10, it is assumed that conductive lines CL1_0 to CL1_n−1 are disposed alongside of word lines of the memory cell array 121.

Referring to FIG. 8, the conductor line array 122 may include conductive lines CL1_0 to CL1_n−1. The number of conductive lines CL1_0 to CL1_n−1 may be variable. For example, the number of conductive lines CL1_0 to CL1_n−1 may be equal to the number of memory blocks. That is, the conductive lines CL1_0 to CL1_n−1 of the conductor line array 122 may correspond to memory blocks BLK0 to BLKn−1 of the memory cell array 121, respectively.

As described with reference to FIG. 2, the command decoder 126 may be used to decode a block erase signal, a chip erase signal, and a random erase signal from a memory controller 110, and may be used to control the compensation magnetic field controller 124 to perform a command received from the memory controller 110.

The block erase signal may be a signal indicating an erase operation where free layers and pinned layers of memory cells in a specific memory block BLKi (refer to FIG. 4) are magnetized to be anti-parallel.

The chip erase signal may be a signal indicating an erase operation where free layers and pinned layers of all memory cells in the memory cell array 121 are magnetized to be anti-parallel.

The random erase signal may be a signal indicating an erase operation where free layers and pinned layers of memory cells, randomly selected, from among memory cells in the memory cell array 121 are magnetized to be anti-parallel.

The compensation magnetic field controller 124 may control a current driver 125 (refer to FIG. 2) such that a current flows via a conductive line (e.g., CL1_2) corresponding to a specific memory block (e.g., BLK2), from among the conductive lines CL1_0 to CL1_n−1, according to a control of the command decoder 126. Also, the specific memory block may include two or more memory blocks. In this case, the compensation magnetic field controller 124 may control the current driver 125 such that a current flows via conductive lines respectively corresponding to specific memory blocks, from among the conductive lines CL1_0 to CL1_n−1. A compensation magnetic field may be generated when a current flows via a conductive line (e.g., CL1_2). Intensity of a current flowing via a conductive line may be determined to generate a compensation magnetic field sufficient to ignore influence of a write current to a magnetization direction of a free layer 11, for example.

A direction of the compensation magnetic field may be determined according to a direction of a current flowing via a conductive line (e.g., CL1_2), and magnetization directions of free layers of memory cells in a specific memory block (e.g., BLK2) may be determined according to the generated compensation magnetic field. For example, a direction of the compensation magnetic field may be determined such that a free layer and a pinned layer are magnetized to be anti-parallel. This may be understood that data '1' is written at memory cells of the specific memory block.

Thus, a semiconductor memory device 120 according to an embodiment of the inventive concept may write data at memory cells in a specific memory block of the memory cell array 121 regardless of a write operation using a write current. In addition, the semiconductor memory device 120 may write data randomly at memory cells of the memory cell array 121 regardless of a write operation using a write current.

Referring to FIGS. 9 and 10, other possible embodiments of the memory cell array 121 may be compared with the embodiment of FIG. 8. Hereafter, only material differences between these embodiments will be described.

Referring to FIG. 9, the number of the conductive lines CL1_0 to CL1_n−1 of the conductor line array 122 may be equal to the number of word lines of the memory cell array 121. That is, the conductive lines CL1_0 to CL1_n−1 may correspond to word lines WL0 to WLn−1, respectively.

Referring to FIG. 10, one conductive may correspond to two word lines (1:2). However, the number and arrangement of the conductive lines CL1_0 to CL1_n−1 may not be limited to this disclosure. A ratio of conductive lines CL1_0 to CL1_n−1 to word lines WL0 to WLn−1 can be determined to be 1:k (k≥0, k being a real number).

In FIGS. 9 and 10, the semiconductor memory device 120 may write data at memory cells connected with a specific word line of the memory cell array 121 regardless of a write operation using a write current.

FIG. 11 is a block diagram illustrating a memory system according to another embodiment of the inventive concept. Only differences between the respective memory systems 100 and 200 of FIGS. 1 and 11 will be described.

Referring to FIG. 11, the memory system 200 may include a memory controller 210 and a semiconductor memory device 220. The semiconductor memory device 220 may include a memory cell array 221, a first conductor line array 222, and a second conductor line array 223.

The memory controller 210 may be the same as a memory controller 110 in FIG. 1. The memory cell array 221 may be the same as a memory cell array 121 described with reference to FIGS. 1, 2, 3 and 4. Thus, the first and second conductor line arrays 222 and 223 will be mainly described.

The first and second conductor line arrays 222 and 223 may be used to generate a compensation magnetic field on the memory cell array 221. That is, the first and second conductor line arrays 222 and 223 may be used to generate a compensation magnetic field capable of controlling the influence of an applied external magnetic field to the memory cell array 221. For example, the compensation magnetic field may have the same magnitude and opposite direction as the applied external magnetic field. The first and second conductor line arrays 222 and 223 may include conductive lines which form current paths.

The first and second conductor line arrays 222 and 223 may be used to generate compensation magnetic fields having different directions. Compensation magnetic fields generated by the first and second conductor line arrays 222 and 223 may generate a mixed compensation magnetic field. For example, compensation magnetic fields generated by the first and second conductor line arrays 222 and 223 may have directions perpendicular to each other. In this case, a mixed compensation magnetic field generated by the first and second conductor line arrays 222 and 223 may have a diagonal direction to an intersection area of a word line and a bit line of the memory cell array 221.

The first and second conductor line arrays 222 and 223 may be disposed on the memory cell array 221. In further detail, the first and second conductor line arrays 222 and 223 may be disposed to be spaced apart from the memory cell array 221 in a direction perpendicular to a substrate of the memory cell array 221. The second conductor line array 223 may be disposed to be spaced apart from the first conductor line array 222. Alternatively, the first and second conductor line arrays 222 and 223 may be disposed alongside of the memory cell array 221.

As described above, the semiconductor memory device 220 of the memory system 200 according to another embodiment of the inventive concept may generate a compensation magnetic field capable of controlling influence of an external magnetic field. In addition, it is possible to control the influence of an applied external magnetic field in various directions using a mixed compensation magnetic field generated by the first and second conductor line arrays 222 and 223. Thus, it is possible to reduce the influence of the applied external magnetic field upon the memory cell array 221 of the semiconductor memory device 220, thereby improving the reliability of stored data in the semiconductor memory device 220.

Figure 12:
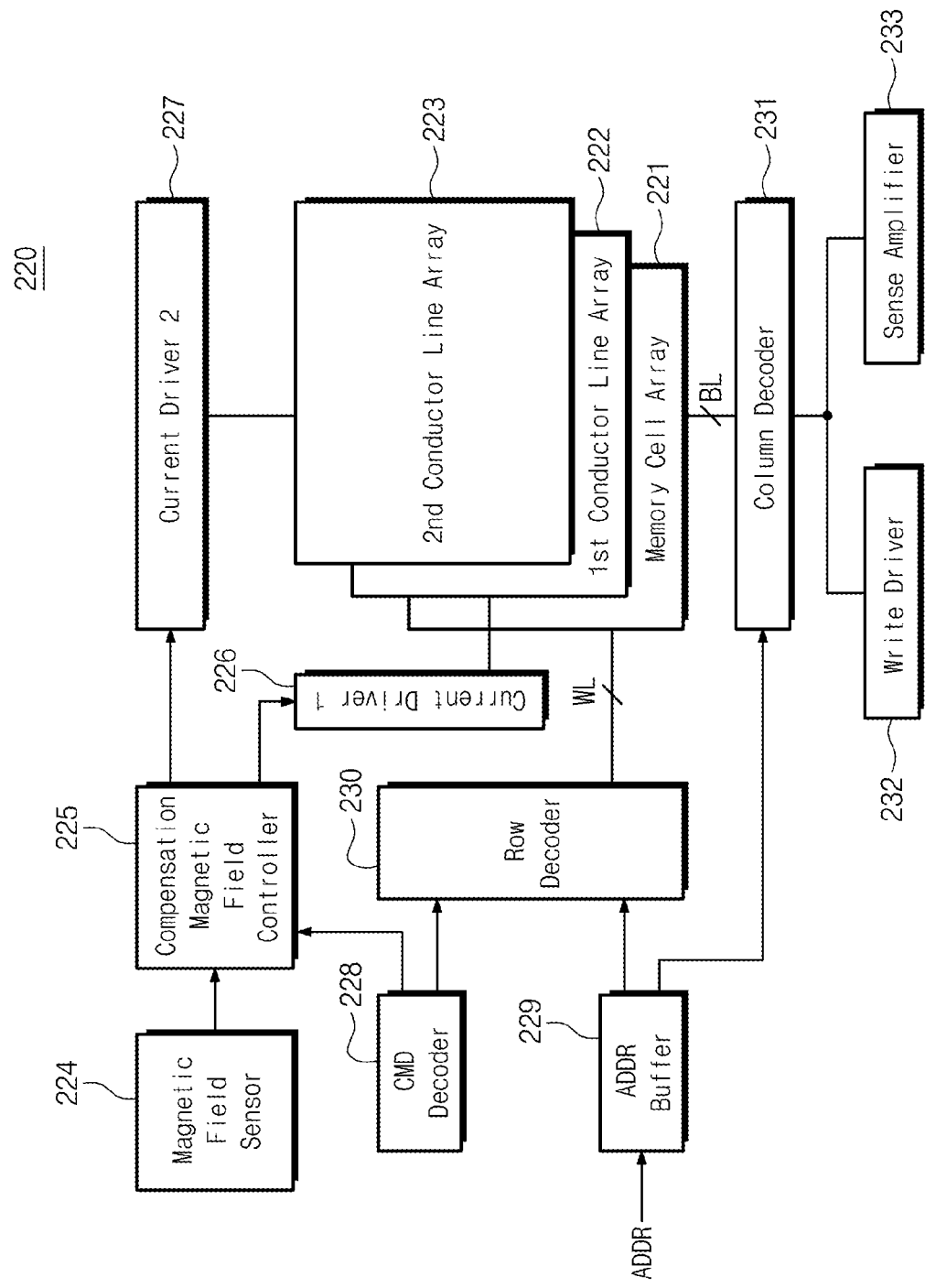
FIG. 12 is a block diagram further illustrating the semiconductor memory device of FIG. 11.

FIG. 12 is a block diagram further illustrating the semiconductor memory device 220 of FIG. 11. Here again, only differences between semiconductor memory devices 120 and 220 of FIGS. 2 and 12 will be described.

Referring to FIG. 12, a semiconductor memory device 220 may include a memory cell array 221, a first conductor line array 222, a second conductor line array 223, a magnetic field sensor 224, a compensation magnetic field controller 225 a first current driver 226, a second current driver 227, a command decoder 228, an address buffer 229, a row decoder 230, a column decoder 231, a write driver 232, and a sense amplifier 233.

The first and second conductor line arrays 222 and 223 may generate compensation magnetic fields capable of controlling influence of an external magnetic field to the memory cell array 221. Each of the first and second conductor line arrays 222 and 223 may include conductive lines which form current paths for generating the compensation magnetic field. For example, conductive lines of the first conductor line array 222 and conductive lines of the second conductor line array 223 may be disposed in different directions (e.g., directions perpendicular to each other). For example, the conductive lines of the first conductor line array 222 may be disposed alongside of word lines of the memory cell array 221. The conductive lines of the second conductor line array 223 may be disposed alongside of bit lines of the memory cell array 221.

The compensation magnetic field controller 225 may receive external magnetic field information from the magnetic field sensor 224. The compensation magnetic field generating controller 225 may generate compensation magnetic field information using the external magnetic field information.

The compensation magnetic field controller 225 may control the first conductor line array 222 and the second conductor line array 223 based on the compensation magnetic field information. The compensation magnetic field controller 225 may control the first conductor line array 222 and the second conductor line array 223, independently. For example, compensation magnetic field controller 225 may control one of the first and second current drivers 226 and 227 according to the compensation magnetic field information.

The compensation magnetic field information may include information associated with a magnitude and a direction of a compensation magnetic field to be generated. For example, magnitude information of the compensation magnetic field may be determined such that the compensation magnetic field has the same magnitude as the external magnetic field. Direction information of the compensation magnetic field may be determined such that the compensation magnetic field has a direction opposite to a direction of the external magnetic field.

The first current driver 226 may supply a current to the first conductor line array 222 according to the control of the compensation magnetic field controller 225. The second current driver 227 may supply a current to the second conductor line array 223 according to the control of the compensation magnetic field controller 225. The first and second current drivers 226 and 227 may provide a current to all or some of conductive lines.

Figure 13:
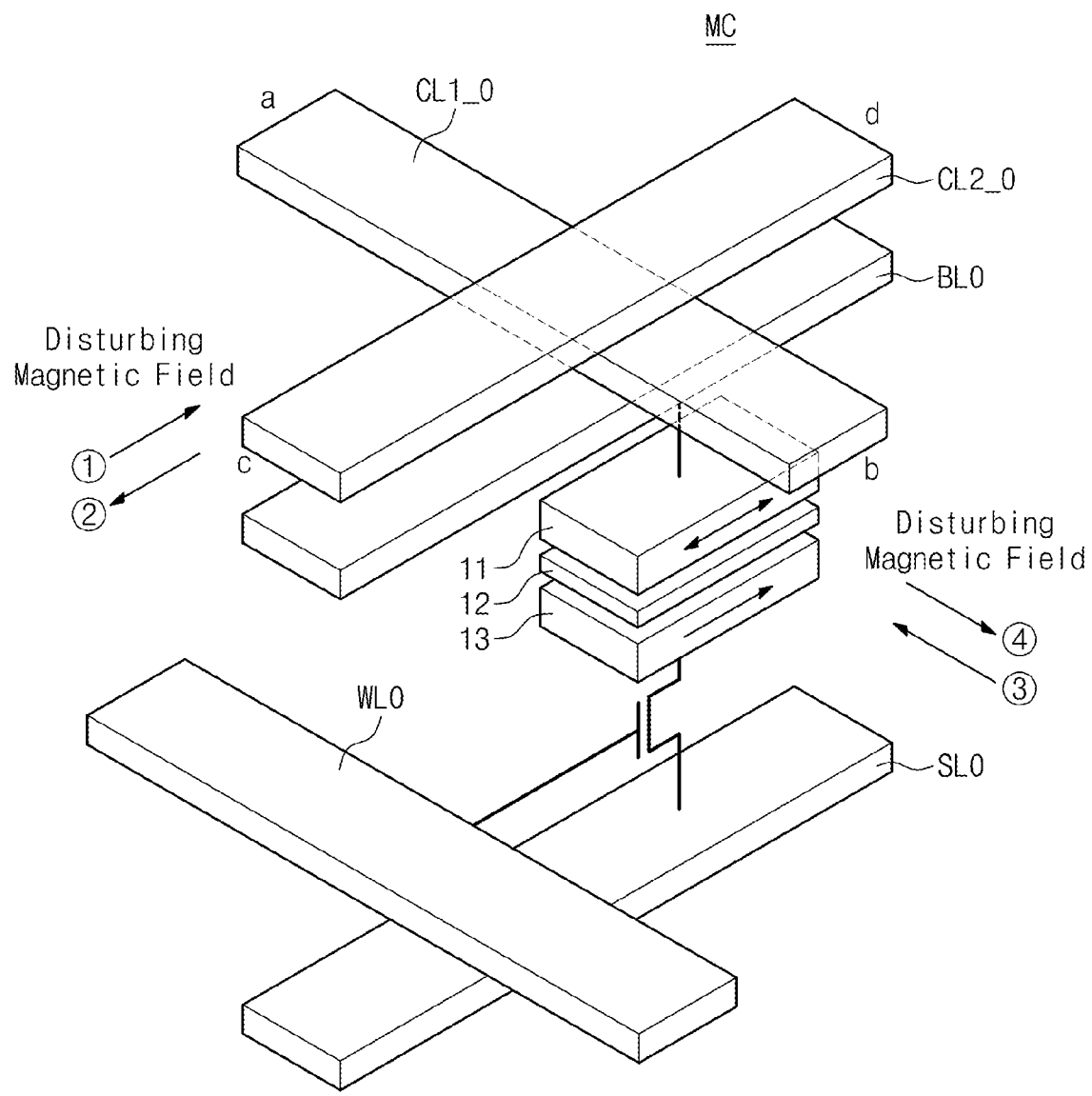
FIG. 13 is a perspective view illustrating one possible arrangement of elements forming a memory cell within the memory cell array of FIG. 12.

FIG. 13 is a perspective view illustrating one possible arrangement of elements forming a memory cell MC in the memory cell array of FIG. 12.

Referring to FIG. 13, a memory cell MC includes an MTJ element 11 to 13 and a cell transistor CT. The gate of the cell transistor is connected to a word line (e.g., WL0), and one end of the cell transistor CT is connected to a bit line (e.g., BL0) via the MTJ element. The other end of the cell transistor CT is connected to a source line (e.g., SL0).

The MTJ element includes a pinned layer 13, a free layer 11, and a tunnel layer 12. The tunnel layer 12 may be interposed between the pinned layer 13 and the free layer 11. A magnetization direction of the pinned layer 13 may be pinned. A magnetization direction of the free layer 11 may have the same direction as the pinned layer 13 or a direction opposite to the pinned layer 13 according to a condition. An antiferromagnetic layer (not shown) may be further provided to pin a magnetization direction of the pinned layer 13.

A conductive line CL1_0 of a first conductor line array 222 (refer to FIG. 12) may be disposed on the bit line BL0. The conductive line CL1_0 may be disposed to be spaced apart from the bit line BL0. The conductive line CL1_0 may be disposed to be perpendicular to a magnetization direction of the free layer 11 of the MTJ element at one side. Thus, a compensation magnetic field generated when a current flows via the conductive line CL1_0 may control influence of an external magnetic field to a magnetization direction of the free layer 11.

A conductive line CL2_0 of a second conductor line array 223 (refer to FIG. 12) may be disposed on the conductive line CL1_0. The conductive line CL2_0 may be disposed to be spaced apart from the conductive line CL1_0. The conductive line CL1_0 may be disposed alongside of a magnetization direction of the free layer 11 of the MTJ element at one side. Thus, a compensation magnetic field generated when a current flows via the conductive line CL2_0 may control influence of an external magnetic field to a magnetization direction of the free layer 11.

For example, in the case that the external magnetic field is generated in a direction indicated by the symbol ①, a compensation magnetic field may be generated by making a current flow from point "b" to point "a" via the conductive line CL1_0. In the case that the external magnetic field is generated in a direction indicated by the symbol ②, a compensation magnetic field may be generated by making a current flow from point "a" to point "b" via the conductive line CL1_0. In the case that the external magnetic field is formed in either direction indicated by symbols ① or ②, no current may flow via the conductive line CL2_0.

However, in the case that the external magnetic field is generated in a direction indicated by the symbol ③, a compensation magnetic field may be generated by making a current flow from point "d" to point "c" via the conductive line CL2_0, and in the case that the external magnetic field is generated in a direction indicated by the symbol ④, a compensation magnetic field may be generated by making a current flow from point "c" to point "d" via the conductive line CL2_0. In the case that the external magnetic field is formed in either direction indicated by the symbols ③ or ④, no current may flow via the conductive line CL1_0.

Accordingly, a compensation magnetic field may be generated in an opposite direction to that of the applied external magnetic field potentially influencing the magnetization direction of the free layer 11.

Figure 14:
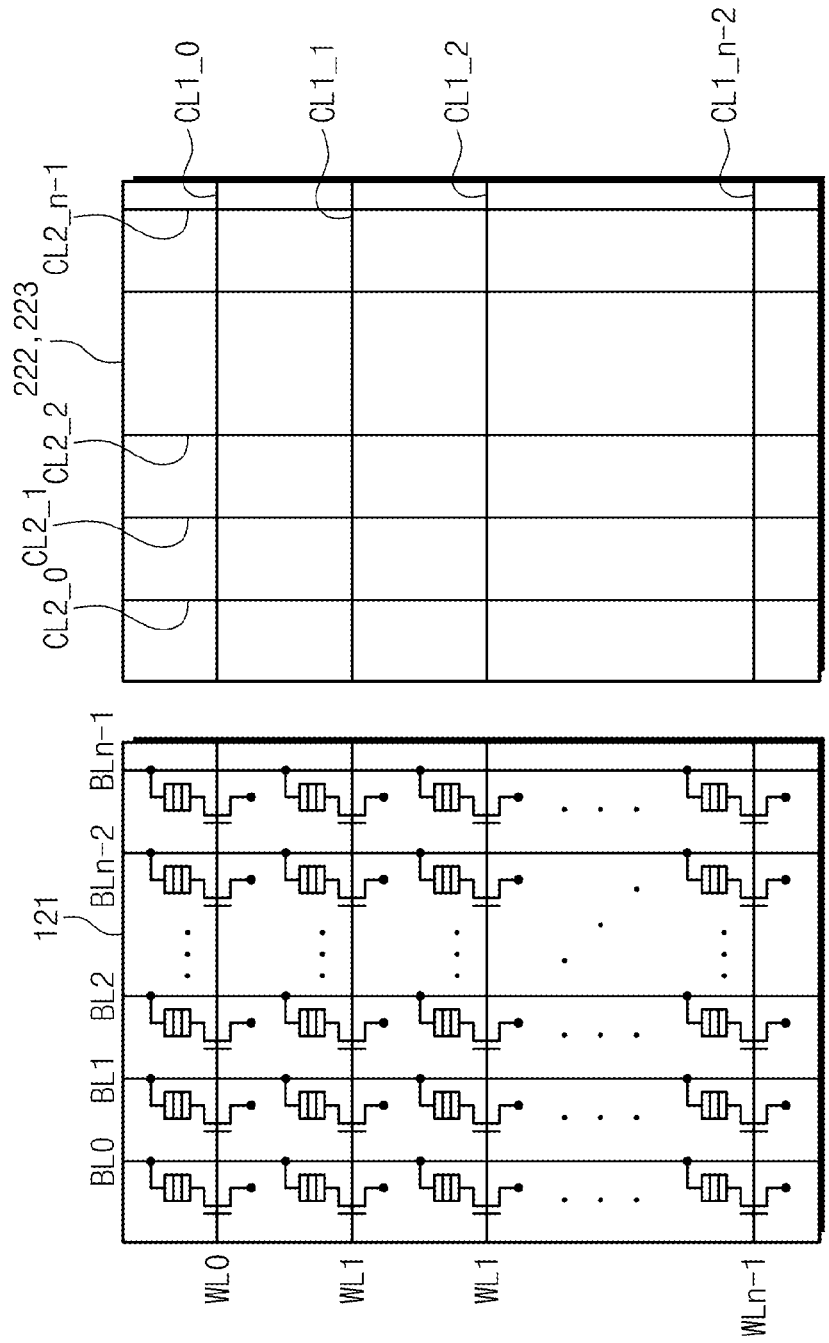
FIGS. 14 and 15 are diagrams respectively illustrating possible embodiments of the memory cell array, as well as the first and second conductor line arrays for the memory cell array of FIG. 12.
Figure 15:
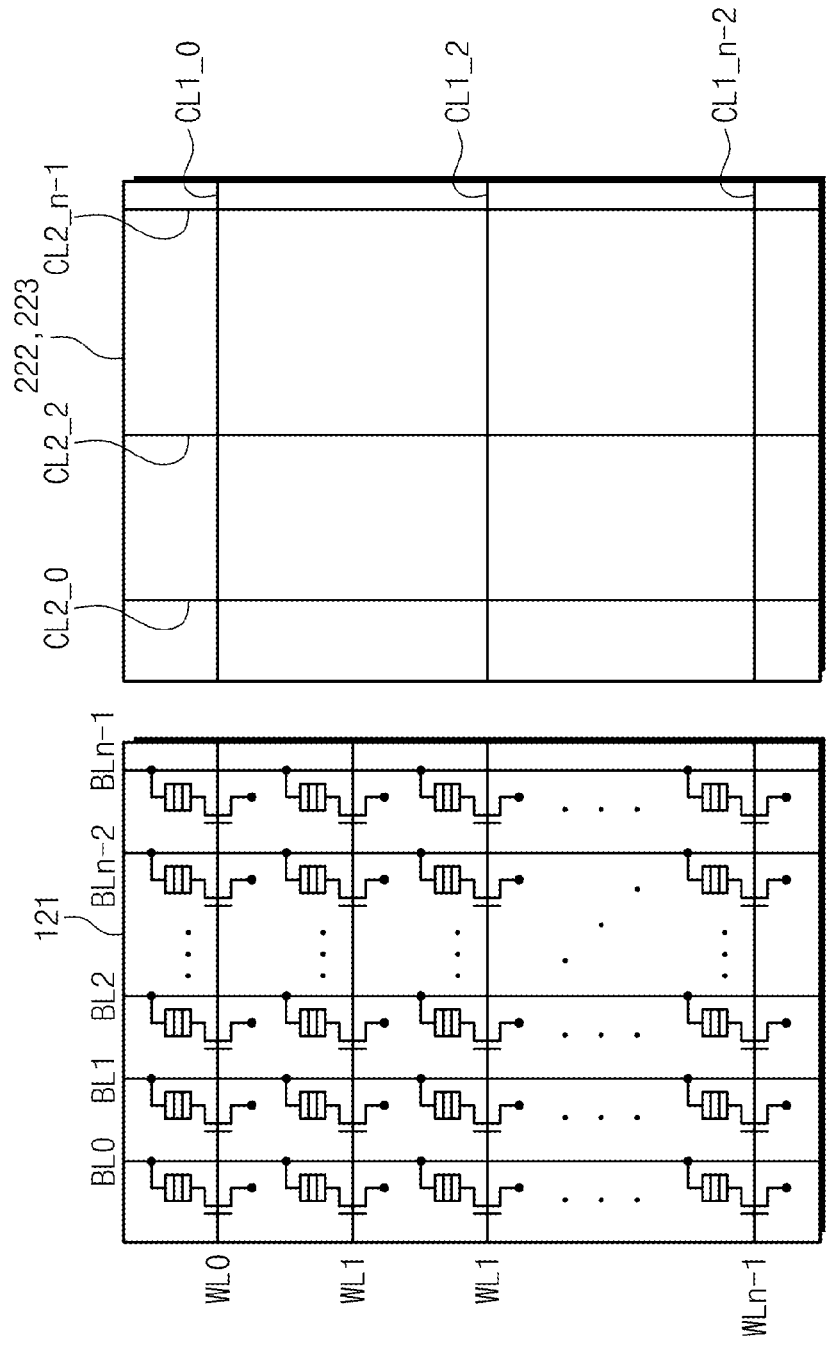

FIGS. 14 and 15 are diagrams respectively illustrating a memory cell array and first and second conductor line arrays of FIG. 12.

Referring to FIG. 14, the number of conductive lines CL1_0 to CL1_n−1 of the first conductor line array 222 may be equal to the number of word lines of a memory cell array 221. That is, the conductive lines CL1_0 to CL1_n−1 of the first conductor line array 222 may correspond to word lines WL0 to WLn−1 of a memory cell array 221, respectively (1:1). The number of conductive lines CL2_0 to CL2_n−1 of the second conductor line array 223 may be equal to the number of bit lines of the memory cell array 221. That is, the conductive lines CL2_0 to CL2_n−1 of the second conductor line array 223 may correspond to bit lines BL0 to BLn−1 of the memory cell array 221, respectively (1:1).

Referring to FIG. 15, one conductive in the first conductor line array 222 may correspond to two word lines (1:2). One conductive in the second conductor line array 223 may correspond to two bit lines (1:2). However, the number and arrangement of the conductive lines CL1_0 to CL1_n−1 and CL2_0 to CL2_n−1 may not be limited to this disclosure. A ratio of the conductive lines CL1_0 to CL1_n−1 to word lines WL0 to WLn−1 can be determined to be 1:k (k≥0, k being a real number). Also, a ratio of the conductive lines CL2_0 to CL2_n−1 to bit lines BL0 to BLn−1 can be determined to be 1:k (k≥0, k being a real number).

The compensation magnetic field controller 225 (refer to FIG. 12) may control first and second a current drivers 226 and 227 (refer to FIG. 12) such that a current flows via specific ones of the conductive lines CL1_0 to CL1_n−1 and CL2_0 to CL2_n−1 according to a control of the command decoder 228. Intensity of a current flowing via a conductive line may be decided to generate a compensation magnetic field sufficient to ignore influence of a write current (refer to FIG. 7) to a magnetization direction of a free layer 11, for example. Conductive lines through which a current flows may generate compensation magnetic fields. For example, in the case that a current flows via conductive lines CL1_0 and CL2_0, a mixed compensation magnetic field may be formed in a diagonal direction to a point where word lines and bit lines of the memory cell array 221 are intersected.

A direction of the compensation magnetic field may be determined according to a direction of a current flowing via conductive lines CL1_0 to CL1_n−1 and CL2_0 to CL2_n−1, and magnetization directions of free layers of memory cells connected with a specific word lines and/or memory cells included in a specific cell string may be determined according to the generated compensation magnetic field. For example, a direction of the compensation magnetic field may be determined such that a free layer and a pinned layer are magnetized to be anti-parallel. This may be understood as a data value of "1" being written at memory cells of a specific memory block.

Thus, the semiconductor memory device 220 according to an embodiment of the inventive concept may write data at memory cells connected with a specific word lines and/or memory cells included in a specific cell string, regardless of a write operation using a write current.

Figure 16:
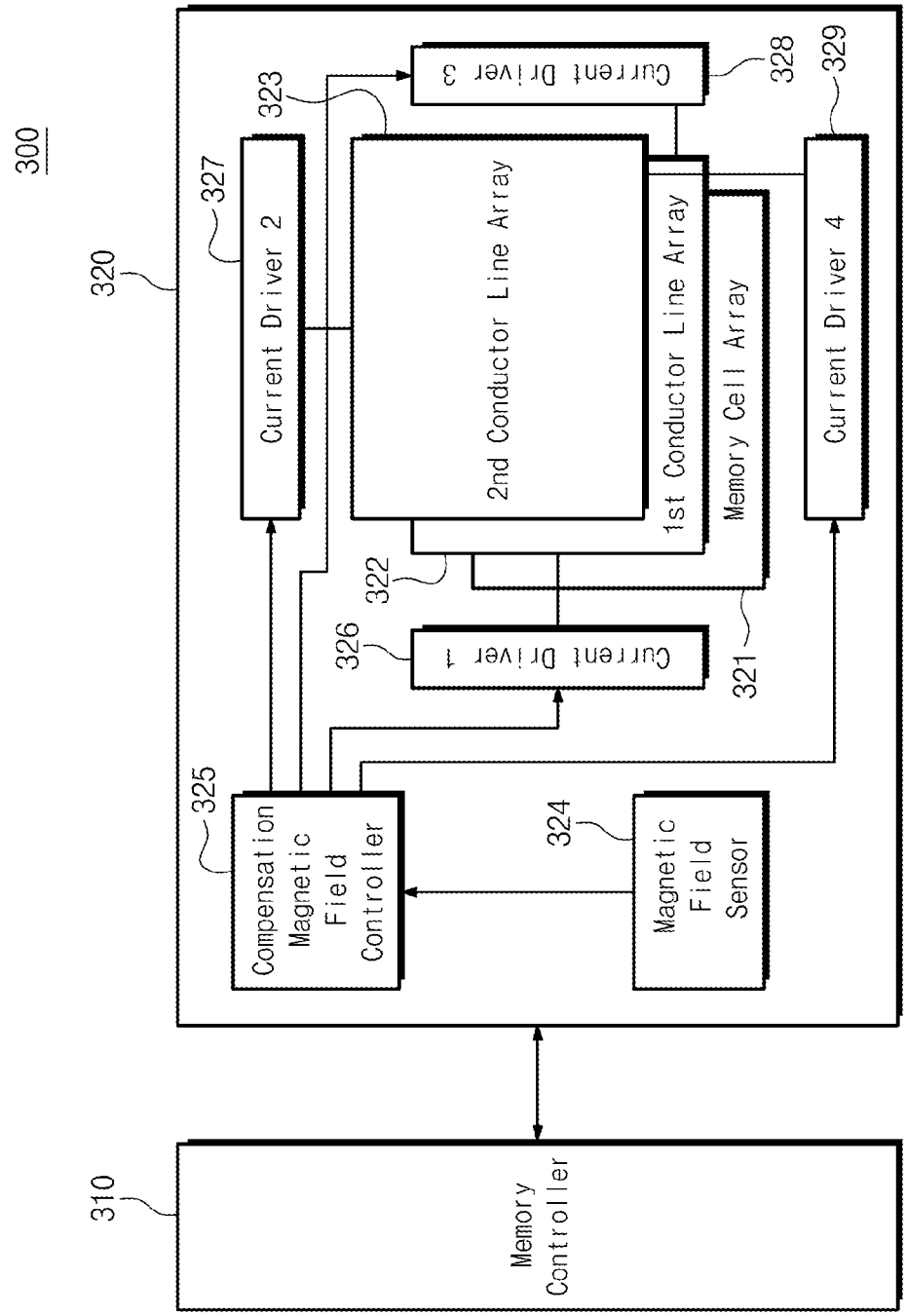
FIG. 16 is a block diagram illustrating a semiconductor memory device according to still another embodiment of the inventive concept.

FIG. 16 is a block diagram illustrating a semiconductor memory device according to another embodiment of the inventive concept.

Referring to FIG. 16, a memory system 300 comprises a memory controller 310 and a semiconductor memory device 320. The semiconductor memory device 320 may include a memory cell array 321, a first conductor line array 322, a second conductor line array 323, a magnetic field sensor 324, a compensation magnetic field controller 325 a first current driver 326, a second current driver 327, a third current driver 328, and a fourth current driver 329.

The memory controller 310 may be the same as a memory controller 110 described with reference to FIG. 1. The memory cell array 321 may be the same as a memory cell array 121 described with reference to FIGS. 1 to 4. The first and second conductor line arrays 322 and 323 may be the same as first and second conductor line arrays 222 and 223 described with reference to FIGS. 11 and 12. Below, the first to fourth current drivers 326 to 329 will be mainly described.

The first and second conductor line arrays 322 and 323 may generate compensation magnetic fields with respect to the memory cell array 321. That is, the first and second conductor line arrays 322 and 323 may generate compensation magnetic fields capable of controlling influence of an external magnetic field to the memory cell array 321. For example, the compensation magnetic field may mean a magnetic field which has the same magnitude of an external magnetic field and a direction opposite thereto. Each of the first and second conductor line arrays 322 and 323 may include conductive lines which form current paths. The conductive lines of the first conductor line array 322 may be disposed alongside of word lines of the memory cell array 321. The conductive lines of the second conductor line array 323 may be disposed alongside of bit lines of the memory cell array 321.

The first to fourth current drivers 326 to 329 may provide currents to conductive lines of the first and second conductor line arrays 322 and 323 to generate compensation magnetic fields. At this time, a direction of a compensation magnetic field may be determined according to a direction in which currents flow via conductive lines.

For example, the first current driver 326 may provide currents to conductive lines of the first conductor line array 322 in a direction of the third current driver 328. The third current driver 328 may provide currents to conductive lines of the first conductor line array 322 in a direction of the first current driver 326.

The second current driver 327 may provide currents to conductive lines of the second conductor line array 323 in a direction of the fourth current driver 329. The fourth current driver 329 may provide currents to conductive lines of the second conductor line array 323 in a direction of the second current driver 327.

Figure 17:
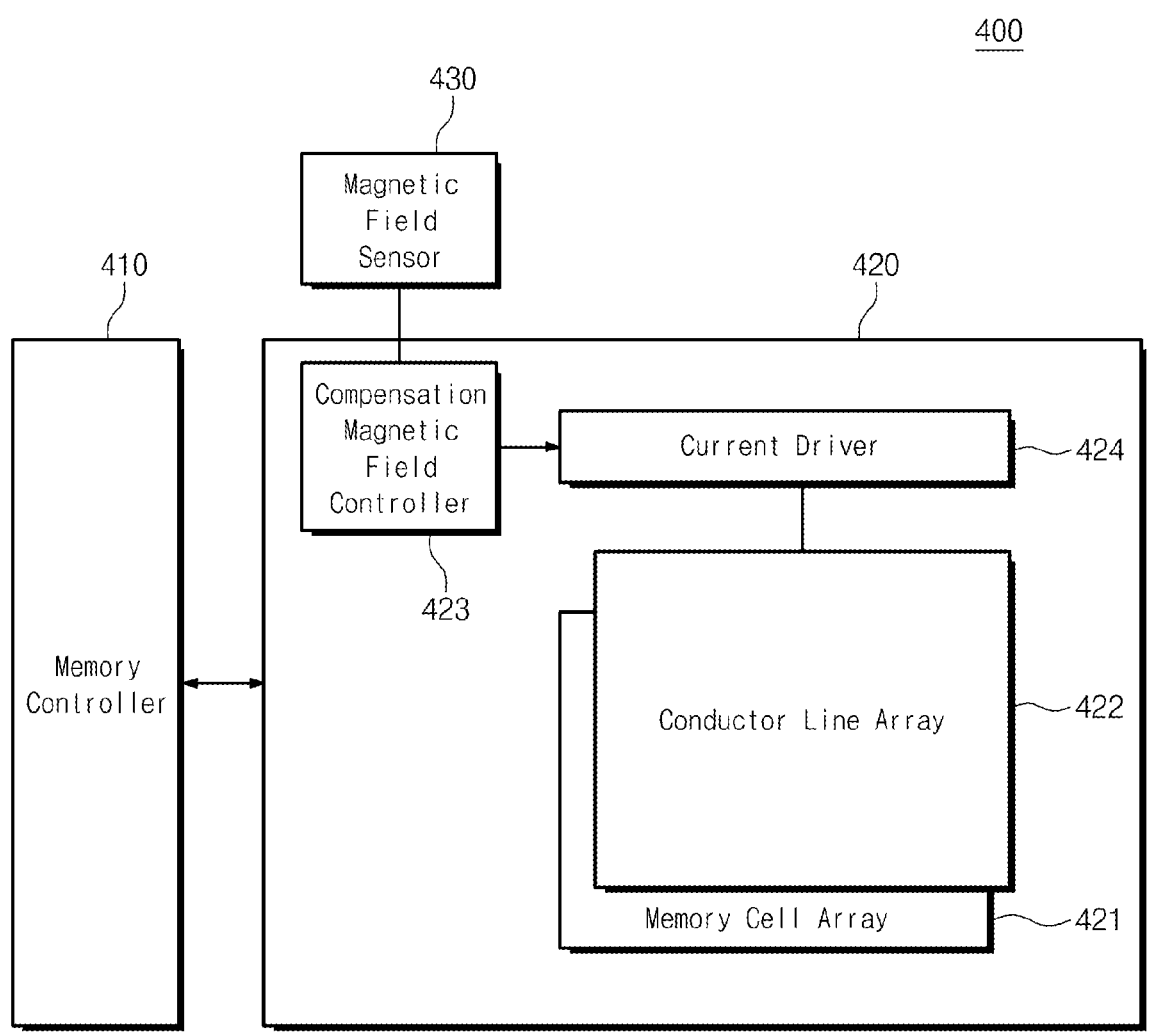
FIG. 17 is a block diagram illustrating a memory system that may incorporate a semiconductor memory device according to an embodiment of the inventive concept.

FIG. 17 is a block diagram illustrating a memory system according to still another embodiment of the inventive concept. Below, differences between a semiconductor memory device 420 of FIG. 17 and the semiconductor memory device 120 described with reference to FIGS. 1 and 2 will be described.

Referring to FIG. 17, a memory system 400 may include a memory controller 410 and a semiconductor memory device 420. The semiconductor memory device 420 may include a memory cell array 421, a conductor line array 422, and a compensation magnetic field controller 423.

In example embodiments, a magnetic field sensor 430 may be disposed outside the semiconductor memory device 420. That is, the magnetic field sensor 430 may sense an external magnetic field to provide external magnetic field information to the compensation magnetic field controller 423 of the semiconductor memory device 420.

Meanwhile, the magnetic field sensor 430 may be implemented at the memory controller 410 in an on-chip type. In this case, it is possible to simplify a structure of the memory system 400.

Figure 18:
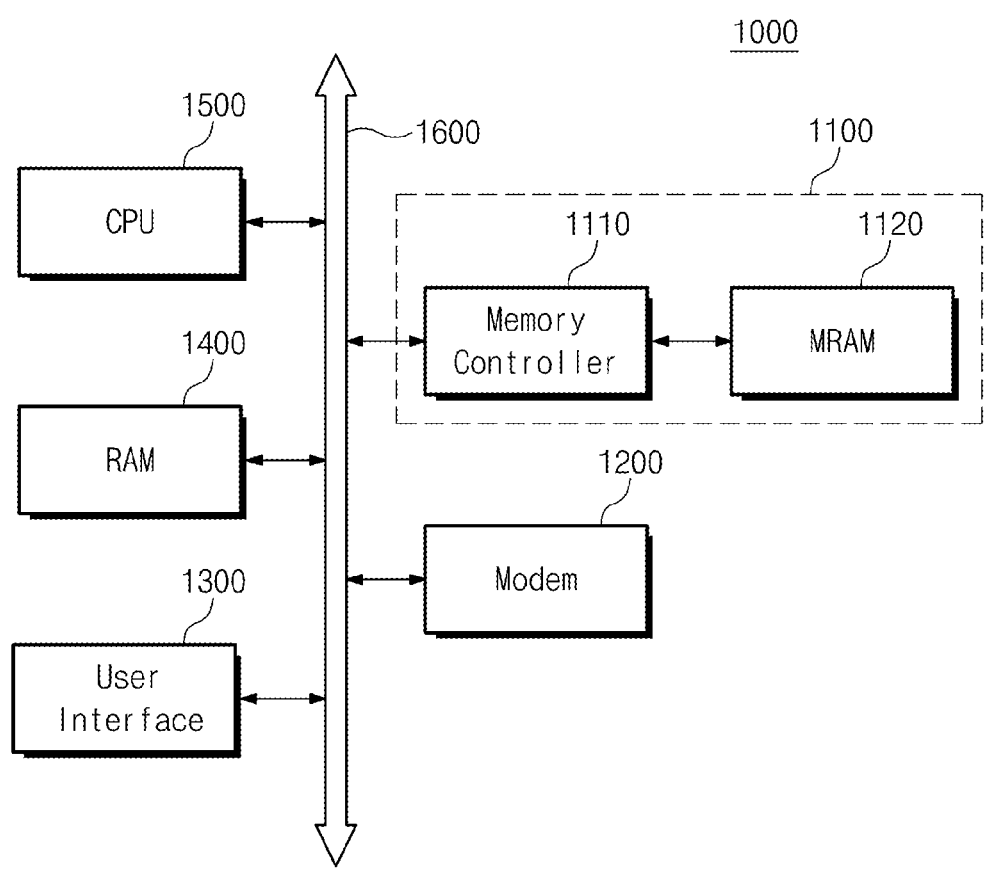
FIG. 18 is a block diagram illustrating a computer system that may incorporate a semiconductor memory device according to an embodiment of the inventive concept.

FIG. 18 is a block diagram illustrating a computer system that may incorporate a semiconductor memory device according to an embodiment of the inventive concept.

Referring to FIG. 18, computer system 1000 such as a mobile device or a desktop computer may be equipped with a memory system 1100. The computer system 1000 may include an MRAM memory system 1100, a modem 1200, a user interface 1300, a RAM 1400, and a CPU 1500 which are electrically connected to a system bus 1600.

The MRAM memory system 1100 may include a memory controller 1110 and a semiconductor memory device 1120. Data processed by the CPU 1500 or input from an external device may be stored at the semiconductor memory device 1120.

A semiconductor memory device including STT-MRAM cells may be applied to at least one of the semiconductor memory device 1120 and the RAM 1400. That is, the semiconductor memory device including STT-MRAM cells may be applied to the semiconductor memory device 1120, which stores mass data for the computer system 1000, or the RAM 1400 which stores system data or data necessitating a rapid access. Although not shown in FIG. 18, the computer system 1000 may further comprise an application chipset, a camera image processor (CIS), an input/output device, and so on.

The MRAM memory system 1100 may be one of memory systems described with reference to FIGS. 1, 11, 16, and 17. Thus, the semiconductor memory device 1120 may generate a compensation magnetic field capable of controlling influence of an external magnetic field. Thus, it is possible to reduce influence of an external magnetic field to a memory cell array of the semiconductor memory device 1120. This may mean that the reliability of the computer system 1000 is improved.

Figure 19:
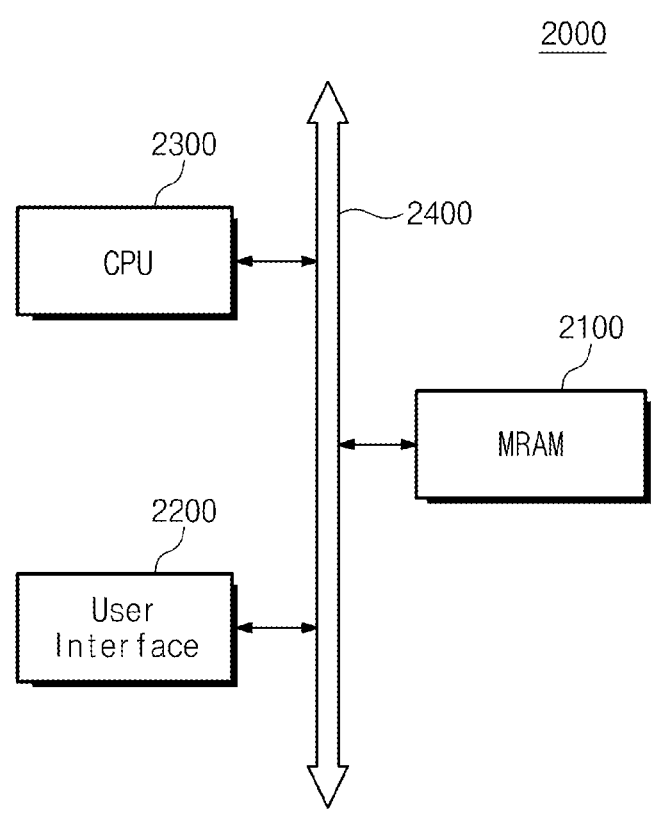
FIG. 19 is a block diagram illustrating another computer system that may incorporate a semiconductor memory device according to an embodiment of the inventive concept.

FIG. 19 is a block diagram illustrating another computer system that may incorporate a semiconductor memory device according to an embodiment of the inventive concept.

Referring to FIG. 19, computer system 2000 such as a mobile device or a desktop computer may be equipped with a semiconductor memory device 2100 including STT-MRAM cells. The computer system 2000 may include the semiconductor memory device 2100 including STT-MRAM cells, a user interface 2200, and a CPU 2300 which are electrically connected to a system bus 2400.

STT-MRAM may be a next-generation memory which has low cost and high capacity of DRAM, operating speed of SRAM, non-volatile characteristic of a flash memory. A conventional system may include a cache memory for a fast processing speed, a RAM, and storage for storing mass data. However, MRAM according to an embodiment of the inventive concept may replace the aforementioned memories. That is, a computer system may be simple in structure by storing mass data rapidly at a memory device including MRAM.

The semiconductor memory device 2100 may be one of semiconductor memory devices described with reference to FIGS. 1, 11, 16, and 17. Thus, the semiconductor memory device 2100 may generate a compensation magnetic field capable of controlling influence of an external magnetic field. Thus, it is possible to reduce influence of an external magnetic field to a memory cell array of the semiconductor memory device 2100. This may mean that the reliability of the computer system 2000 is improved.

While the inventive concept has been described with reference to exemplary embodiments, it will be apparent to those skilled in the art that various changes and modifications may be made without departing from the scope of the present inventive concept as defined by the following claims.

What is claimed is:

1. A semiconductor memory device comprising:
    a memory cell array including nonvolatile memory cells respectively arranged at intersections between word lines and bit lines, each nonvolatile memory cell having a variable resistance element;
    a conductor line array, corresponding to the memory cell array, and including an array of conductive lines, different than the word lines and bit lines, and establishing current paths and configured to generate a compensation magnetic field with respect to the nonvolatile memory cells of the memory cell array;
    a current driver configured to supply current to the conductive lines;
    a magnetic field sensor configured to sense an applied external magnetic field and in response generate external magnetic field information; and
    a compensation magnetic field controller configured to generate compensation magnetic field information in response to the external magnetic field information, and to control the current driver in accordance with the compensation magnetic field information to supply current to the array of conductive lines to generate the compensation magnetic field to compensate for an influence of the applied external magnetic field upon memory cells in the memory cell array.

2. The semiconductor memory device of claim 1, wherein the conductor line array is spaced apart from the memory cell array in a direction perpendicular to a substrate of the memory cell array.

3. The semiconductor memory device of claim 1, wherein respective conductive lines are disposed lateral to a corresponding word line or a corresponding bit line of the memory cell array.

4. The semiconductor memory device of claim 3, wherein a ratio of conductive lines in the conductive line array to word lines or bit lines in the memory cell array is 1 to "n", wherein n is a number greater than 0.

5. The semiconductor memory device of claim 1, wherein the variable resistance element comprises:
a free layer having a variable magnetization direction; and
a pinned layer having a fixed magnetization direction,
wherein the conductive lines of the conductor line array are disposed either perpendicular to, or horizontal with a magnetization direction of the free layer.

6. The semiconductor memory device of claim 1, wherein the memory cell array comprises a plurality of memory blocks, and the conductive lines of the conductor line array are respectively disposed to correspond to the plurality of memory blocks.

7. The semiconductor memory device of claim 1, wherein the external magnetic field information includes at least one of:
magnitude information for the applied external magnetic field, such that the compensation magnetic field information includes corresponding magnitude information for the compensation magnetic field, and
direction information for the applied external magnetic field, such that the compensation magnetic field information includes corresponding direction information for the compensation magnetic field.

8. The semiconductor memory device of claim 1, wherein the compensation magnetic field has a same magnitude and opposite direction as that of the applied external magnetic field.

9. The semiconductor memory device of claim 7, wherein at least one of the corresponding magnitude information and the corresponding direction information for the compensation magnetic field is determined according to an intensity of at least one current flowing through at least one conductive line.

10. A semiconductor memory device comprising:
a memory cell array including nonvolatile memory cells respectively arranged at intersection between word lines and bit lines, each nonvolatile memory cell having a variable resistance element;
a first conductor line array, corresponding to the memory cell array, and including an array of first conductive lines, different than the word lines and bit lines, and arranged in a first direction, and a second conductor line array, corresponding to the memory cell array, and including an array of second conductive lines, different than the word lines and bit lines, and arranged in a second direction different from the first direction;
the first and second conductor line arrays establishing current paths and configured to generate a compensation magnetic field with respect to the nonvolatile memory cells of the memory cell array;
a first current driver configured to supply a first current to the first conductive lines in response to compensation magnetic field information, and a second current driver configured to supply a second current to the second conductive lines in response to the compensation magnetic field information;
a magnetic field sensor configured to sense an applied external magnetic field and in response to generate external magnetic field information; and
a compensation magnetic field controller configured to generate the compensation magnetic field information in response to the external magnetic field information, and to control the first and second current drivers in accordance with the compensation magnetic field information to supply current to the arrays of first and second conductive lines to generate the compensation magnetic field to compensate for an influence of the applied external magnetic field upon memory cells in the memory cell array.

11. The semiconductor memory device of claim 10, wherein the variable resistance element comprises:
a free layer having a variable magnetization direction; and
a pinned layer having a fixed magnetization direction; and
wherein respective first conductive lines are disposed perpendicular to a magnetization direction of the free layer, and respective second conductive lines are disposed in parallel with the magnetization direction of the free layer.

12. The semiconductor memory device of claim 10, wherein the first and second conductor line arrays are respectively spaced apart from the memory cell array in a direction perpendicular to a substrate of the memory cell array.

13. The semiconductor memory device of claim 10, wherein the first direction is perpendicular to the second direction.

14. A method of operating a semiconductor memory device including a memory cell array of nonvolatile memory cells respectively arranged at intersection between word lines and bit lines, each nonvolatile memory cell having a variable resistance element, the method comprising:
sensing an external magnetic field applied to the memory cell array, and in response, generating external magnetic field information;
generating compensation magnetic field information based on the external magnetic field information; and
generating a compensation magnetic field applied to the memory cell array in accordance with the compensation magnetic field information by controlling a current driver to supply current to a conductor line array, corresponding to the memory cell array, and including an array of conductive lines, different than the word lines and bit lines, and establishing current paths to generate the compensation magnetic field to compensate for an influence of the applied external magnetic field upon memory cells in the memory cell array.

15. The method of claim 14, wherein the conductor line array is divided into first conductive lines extending in a first direction and second conductive lines extending in a second direction perpendicular to the first direction, and controlling the current driver comprises:
using a first current driver to supply a first current to the first conductive lines; and
using a second current driver to supply a second current to the second conductive lines independent of operation by the first current driver.

16. The method of claim 14, wherein each one of the nonvolatile memory cells is a Spin Transfer Resistive Random Access Memory (STT-MRAM).

* * * * *